(12) United States Patent
Imaoka et al.

(10) Patent No.: US 8,063,846 B2
(45) Date of Patent: Nov. 22, 2011

(54) SEMICONDUCTOR MODULE AND MOBILE APPARATUS

(75) Inventors: Toshikazu Imaoka, Ogaki (JP); Takeshi Otsuka, Hashima (JP); Tetsuro Sawai, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 623 days.

(21) Appl. No.: 11/966,130

(22) Filed: Dec. 28, 2007

(65) Prior Publication Data

US 2008/0158091 A1  Jul. 3, 2008

(30) Foreign Application Priority Data

Dec. 28, 2006  (JP) .................................. 2006-354010
Dec. 14, 2007  (JP) .................................. 2007-323180

(51) Int. Cl.
*H01Q 1/52* (2006.01)

(52) U.S. Cl. ........................................................ 343/851

(58) Field of Classification Search .................. 343/851, 343/842; 257/687; 455/557
See application file for complete search history.

(56) References Cited

U.S. PATENT DOCUMENTS

| | | | |
|---|---|---|---|
| 7,084,465 B2* | 8/2006 | Shibata et al. | 257/392 |
| 7,369,086 B2* | 5/2008 | Luen | 343/700 MS |
| 7,592,968 B2* | 9/2009 | Modro | 343/873 |
| 2004/0079999 A1* | 4/2004 | Shibata et al. | 257/371 |
| 2004/0235519 A1* | 11/2004 | Frielink et al. | 455/557 |
| 2006/0038176 A1* | 2/2006 | Akimoto et al. | 257/59 |
| 2006/0119344 A1* | 6/2006 | Benke et al. | 324/126 |
| 2006/0237831 A1* | 10/2006 | Danno et al. | 257/678 |

FOREIGN PATENT DOCUMENTS

| | | |
|---|---|---|
| JP | 2002-271088 | 9/2002 |
| JP | 2004-111656 | 4/2004 |

* cited by examiner

*Primary Examiner* — Huedung Mancuso
(74) *Attorney, Agent, or Firm* — Fish & Richarson P.C.

(57) ABSTRACT

A semiconductor module includes a multilayer board, a first circuit element mounted on the multilayer board, a second circuit element stacked on the first circuit element, an interposer board, provided between the first circuit element and the second circuit element, which includes an antenna conductor, a passive element, mounted on the multilayer board, which is connected to the antenna conductor, and a molded resin layer which seals the respective elements. The antenna conductor is structured by a spiral-shaped wiring pattern and the both ends of the antenna conductor are connected to the passive element via a bonding wire. The antenna conductor functions as a loop antenna with the passive element inserted.

20 Claims, 24 Drawing Sheets

Semiconductor Module and Mobile Apparatus

CROSS-REFERENCE TO RELATED APPLICATIONS

This application is based upon and claims the benefit of priority from the prior Japanese Patent Applications No. 2006-354010, filed on Dec. 28, 2006, and Japanese Patent Application No. 2007-323180, filed on Dec. 14, 2007, the entire contents of which are incorporated herein by reference.

BACKGROUND OF THE INVENTION

1. Field of the Invention

The present invention relates to a semiconductor module and, more particularly, to a semiconductor module having a plurality of stacked circuit elements and a mobile apparatus mounting the semiconductor module thereon.

2. Description of the Related Art

Recently, a packaging technology known to realize smaller size and functional sophistication for circuit devices used in electronic equipment is a multilayer stack structure (multichip package structure) capable of mixed packaging of a plurality of circuit elements. With circuit devices of multilayer stack structure, however, mixed packaging by stacking, for instance, a circuit element comprising an analog circuit and a circuit element comprising a digital circuit may present problems. For example, the high-frequency noise (noise containing high-frequency components) occurring in the circuit element having a digital circuit operating at high speed can be propagated to the circuit element having an analog circuit which is likely to be affected by the noise, and thereby interferes with the performance of the circuit element having the analog circuit. This destabilizes the operation of the circuit device, thus lowering the reliability thereof.

As a countermeasure to such noise propagation, for example, a technology is known wherein noise propagation between circuit elements is intercepted by inserting a heat-transmitting conductor (metallic plate), which is held at ground potential, between a semiconductor chip comprising an analog circuit (circuit element having an analog circuit) and a semiconductor chip comprising a digital circuit (circuit element having a digital circuit).

Also, a technology is known wherein an aerial circuit (antenna) of metallic wiring, which is provided in the outer periphery of an electromagnetic radiation source (a circuit element having a digital circuit), absorbs unwanted radiation (noise) therefrom, thus controlling the noise propagation from the electromagnetic radiation source.

With the method according to the former known technology, however, potential variation can occur within the plane of the metallic plate due to the noise (especially the noise containing high-frequency components) propagating from the circuit element having a digital circuit to the metallic plate. And during the process of the potential variation propagating to a grounding link (ground point) via the metallic plate, the potential variation can enter as noise into the circuit element having an analog circuit which is in the propagation path.

The method according to the latter known technology may be effective if the circuit element having a digital circuit and the circuit element having an analog circuit are placed side by side on the same plane. But it may not function effectively to control noise in the vertical direction between the circuit elements if a multilayer stack structure is employed with the circuit elements provided with antennas in the outer periphery thereof stacked one on top of the other.

SUMMARY OF THE INVENTION

The present invention has been made in view of the foregoing circumstances, and a general purpose thereof is to provide a semiconductor module capable of effectively suppressing and reducing noise propagation between stacked circuit elements.

In order to resolve the above problems, a semiconductor module according to one embodiment of the present invention comprises: a first circuit element; a conductor, provided above the first circuit element, which functions as a loop antenna; and a second circuit element stacked above the conductor.

By employing this embodiment, the antenna conductor, which functions as a loop antenna, is provided between the first circuit element and the second circuit element. The provision of this antenna conductor can shield noise propagation between the first circuit element and the second circuit element by absorbing it. This contributes to stabilizing the operation of the semiconductor module, thus improving the reliability thereof.

In the above structure, the conductor is preferably arranged in a superposed manner such that the conductor shields at least part of a common region as viewed from top where the first circuit element and the second circuit element are overlapped with each other. In this manner, the common region, where the first circuit element and the second circuit element are the closest to each other in the vertical (up-and-down) direction, is where the circuit elements are the most vulnerable to the effects of noise. And the antenna conductor is arranged in an overlapped manner such that the antenna conductor shields the common region. Hence, the noise arising from each circuit element can be shielded by the conductor that absorbs it more reliably.

In the above structure, the conductor may be arranged in a superposed manner such that the conductor selectively covers a circuit region, which is a noise generating source, partially contained in at least one of the first circuit element and the second element circuit. In such case, the conductor is disposed in such superposition as to selectively cover the noise-producing circuit region which is the most vulnerable to the effects of noise. Thus, the noise propagation from circuit elements having such a circuit region can be shielded more reliably.

In the above structure, the conductor may have an outer edge in a position outside the second circuit element. With this arrangement, heat can be radiated from the part thereof outside the outer edge of the second circuit element. This can reduce the temperature rise in the conductor which results from the absorption of noise. Consequently, the performance characteristics of the conductor as a loop antenna can be stabilized, thus allowing it to stably intercept noise propagation.

In the above structure, it is preferable that noise propagation between the first circuit element and the second circuit element is attenuated by a resonance of the loop antenna of the conductor. With this arrangement, the noise propagation between the circuit elements can be more effectively and more reliably suppressed.

In the above structure, the conductor is preferably such that a passive element is connected to a feeding point of the loop antenna formed by the conductor. In such a case, the frequencies or the frequency bands of the noise to be intercepted as a result of the absorption can be adjusted by controlling the characteristics of the passive element connected to the conductor. Thus, the noise propagation can be reduced more effectively.

In the above structure, it is preferable that noise propagation between the first circuit element and the second circuit element is attenuated by a resonance between the conductor and the passive element. This arrangement makes sure that the noise propagation between the circuit elements is reduced.

In the above structure, the conductor may be of spiral shape.

Another embodiment of the present invention relates to a portable device. This portable device may mount any one of the above-described semiconductor modules.

It is to be noted that any arbitrary combinations or rearrangement of the aforementioned structural components and so forth are all effective as and encompassed by the embodiments of the present invention.

Moreover, this summary of the invention does not necessarily describe all necessary features so that the invention may also be sub-combination of these described feature

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
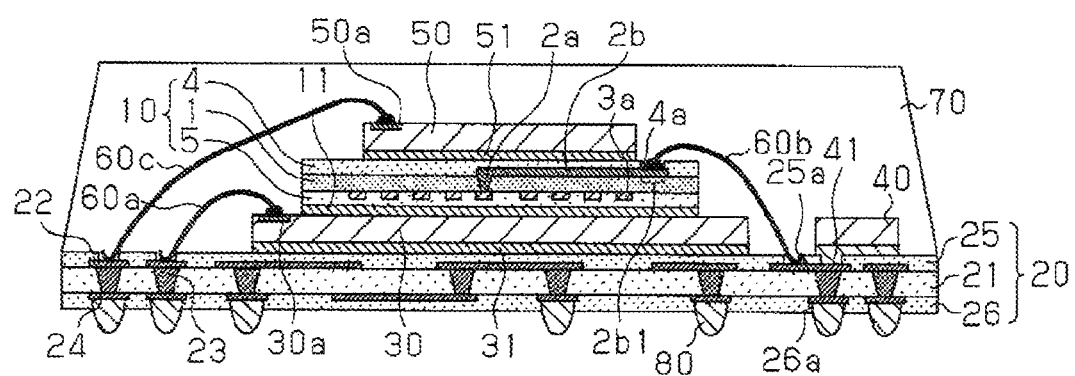
FIG. 1 is a cross-sectional view showing a structure of a semiconductor module according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given to the identical components and the description thereof is omitted as appropriate.

First Embodiment

Figure 2:
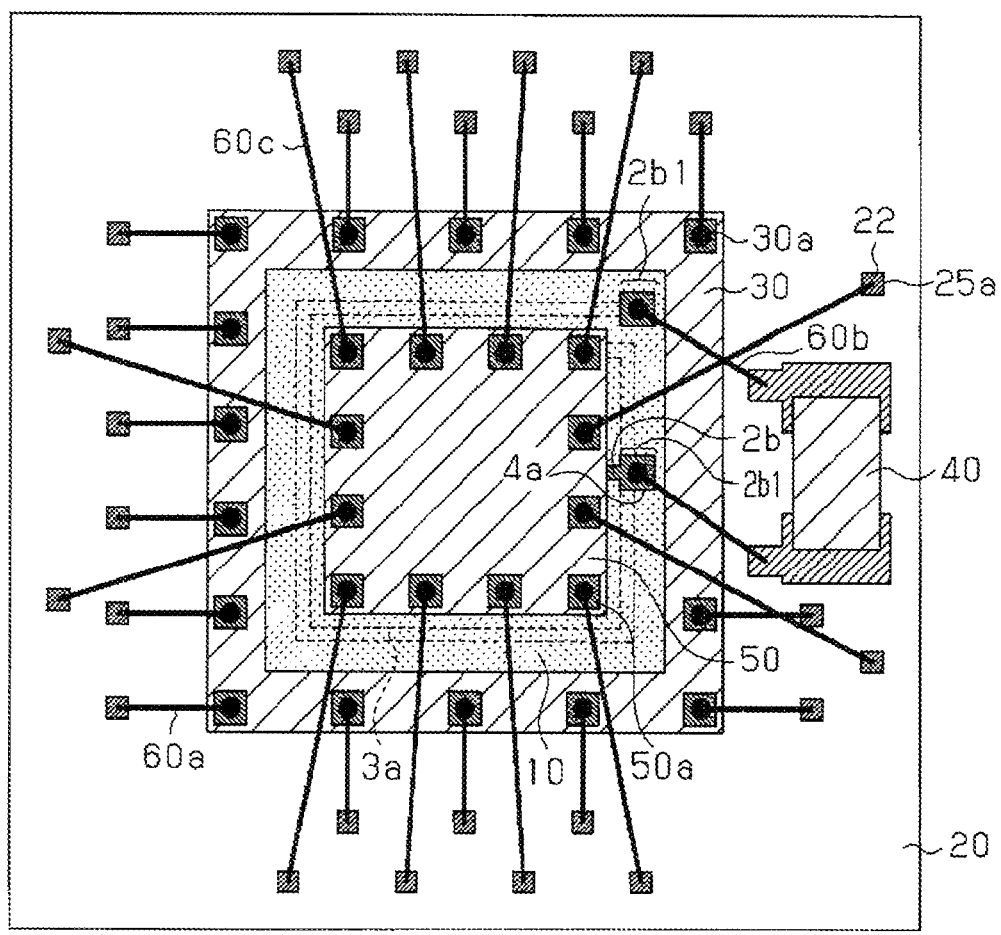
FIG. 2 is a plan view of a semiconductor module according to a first embodiment of the present invention.

FIG. 1 is a cross-sectional view showing a structure of a semiconductor module according to a first embodiment of the present invention. FIG. 2 is a plan view (top view) of the semiconductor module according to the first embodiment. The semiconductor module according to the first embodiment includes a multilayer board 20, a first circuit element 30 mounted on the multilayer board 20, a second circuit element 50 placed and stacked above the first circuit element 30, an interposer board 10, including an antenna conductor 3a, disposed between the first circuit element 30 and the second circuit element 50, a passive element 40 mounted on the multilayer board 20 and connected to the antenna conductor 3a, and a molded resin layer 70 sealing the respective elements The multilayer board 20, which is, for instance, a base board of two-layer wiring structure, has a wiring layer 22 and a wiring layer 24 on the upper face and the lower face thereof, respectively, with an insulating layer 21 disposed in between. The wiring layer 22 and the wiring layer 24 are electrically connected to each other by a via-plug 23 which penetrates the insulating layer 21. The insulating layer 21 is formed of, for instance, an epoxy resin, whereas the wiring layer 22, the wiring layer 24 and the via-plug 23 are formed of, for instance, copper (Cu). Also, formed on the bottom face of the multilayer board 20 are a plurality of external connection electrodes (solder balls) 80 which are connected to the wiring layer 24.

The first circuit element 30, which is, for instance, a circuit element with a digital circuit formed on the upper face thereof, is mounted on the multilayer board 20 through the medium of adhesive 31, such as a die-attach film, in a predetermined region thereof. A plurality of pad electrodes 30a, which are connected to the digital circuit, are provided on the upper face (surface) of the outer periphery of the first circuit element 30, and they are electrically connected to pad electrodes (wiring layer 22) provided on the upper face of the multilayer board 20 via a bonding wire 60a of gold or the like.

The second circuit element 50, which is, for instance, a circuit element with an analog circuit formed on the upper face thereof, is mounted as an upper layer above the first circuit element 30. The dimensions of the second circuit element 50 are smaller than those of the first circuit element 30, and the whole of the second circuit element 50 is superposed on the first circuit element 30. And a plurality of pad electrodes 50a, which are connected to the analog circuit, are provided on the upper face (surface) of the outer periphery of the second circuit element 50, and they are electrically connected to pad electrodes (wiring layer 22) provided on the upper face of the multilayer board 20 via a bonding wire 60c of gold or the like.

Provided between the first circuit element 30 and the second circuit element 50 is the interposer board 10 having an antenna conductor 3a which functions as a loop antenna. The interposer board 10 is disposed in a predetermined region on the first circuit element 30 through the medium of adhesive 11, such as a die-attach film, and the second circuit element 50 is mounted on the interposer board 10 through the medium of adhesive 51, such as a die-attach film.

The passive element 40, which is, for instance, a capacitor of a predetermined capacitance value, is mounted in a predetermined region on the multilayer board 20. The passive element 40 is electrically connected to a pad electrode (wiring layer 22) provided on the upper face of the multilayer board 20 through the medium of conductive adhesive 41, such as silver (Ag) paste. And this pad electrode is electrically connected to a pad electrode 2b1 on the upper face (surface) of the interposer board 10 via a bonding wire 60b of gold or the like.

The molded resin layer 70, which is formed in such a manner as to cover the whole area above the multilayer board 20, seals such elements as the first circuit element 30, the interposer board 10, the passive element 40 and the second circuit element 50. This molded resin layer 70 has a function of protecting these elements against the external environment.

Now a description will be given of the interposer board 10.

Figure 3:
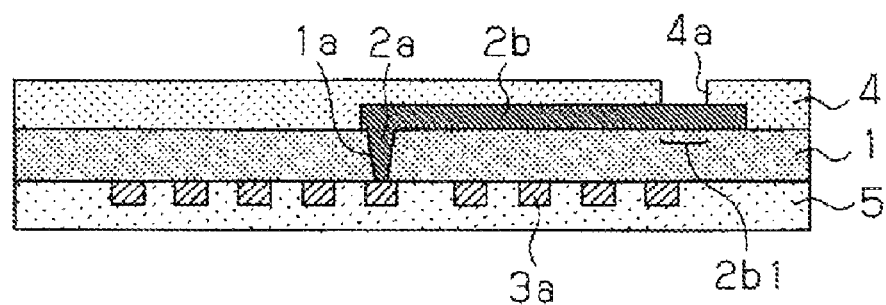
FIG. 3 is a cross-sectional view showing a structure of an interposer board in a first embodiment of the present invention.
Figure 4:
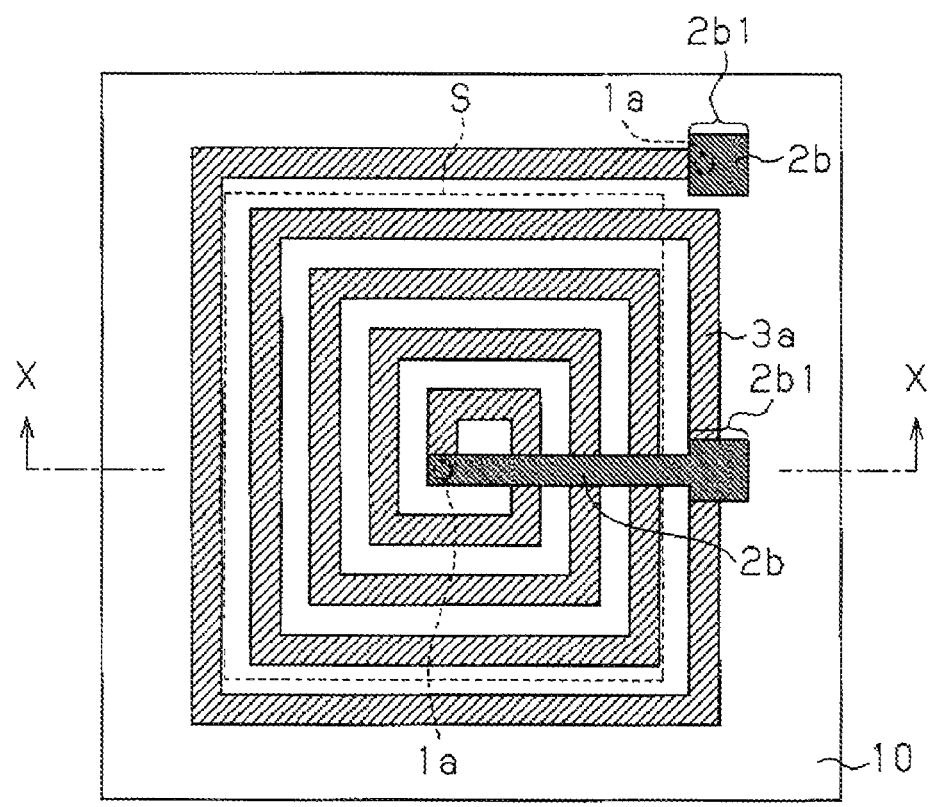
FIG. 4 is a layout plan of an antenna conductor in an interposer board in a first embodiment of the present invention.

FIG. 3 is a cross-sectional view showing a structure of an interposer board in a semiconductor module herein. FIG. 4 is a layout plan of an antenna conductor in the interposer board. Note that FIG. 3 is equal to a cross section taken along line X-X of FIG. 4.

The interposer board 10 is structured with, from top down, a solder resist layer 4, a wiring layer 2b, an insulating resin layer 1 including a via-plug 2a, an antenna conductor 3a, and a solder resist layer 5. On the upper face of the insulating resin layer 1, the wiring layer 2b, which includes a bridge line and a pad electrode 2b1, is formed, and the solder resist layer 4 having an opening 4a in a position corresponding to the pad electrode 2b1 is formed over this wiring layer 2b. On the lower face of the insulating resin layer 1, on the other hand, the antenna conductor 3a is formed, and the solder resist layer 5 is formed over the antenna conductor 3a. Further, the wiring layer 2b and the antenna conductor 3a are electrically connected with each other by the via-plug 2a which penetrates the insulating resin layer 1. Note that the insulating resin layer 1 is formed of, for instance, an epoxy resin, whereas the wiring layer 2b, the via-plug 2a and the antenna conductor 3a are formed of, for instance, copper.

The antenna conductor 3a, as shown in FIG. 4, is comprised of a spiral-shaped wiring pattern, and both ends thereof are connected to the respective pad electrodes 2b1 of the wiring layer 2b through the via-plug 2a and the bridge line. And these pad electrodes 2b1, as shown in FIG. 2, are connected to the passive element 40 via a bonding wire 60b or the like. Through the arrangement as described above, the antenna conductor 3a functions as a loop antenna with the passive element 40 inserted therein. Note here that the frequency (resonance frequency) which is determined by a resonance between the antenna conductor 3a and the passive element 40 is so chosen as to be equal to the frequency of noise from the first circuit element 30 (or the second circuit element 50). Also note that the pad electrodes 2b1 to which the passive element 40 is connected act as the feeding points of the loop antenna (connection point with external load).

As shown in FIG. 4, the outer perimeter (dimensions) of the antenna conductor 3a is formed larger than the outer perimeter (dimensions) of a common region S (the region enclosed by a broken line in FIG. 4) where the first circuit element 30 and the second circuit element 50 overlap as viewed from top, and the antenna conductor 3a is disposed in such a manner as to cover the whole of the common region S. In other words, the antenna conductor 3a is arranged between the first circuit element 30 and the second circuit element 50 in an overlapped manner such that at least part of the common region where the first circuit element 30 and the second circuit element 50 are overlapped with each other is covered and shielded when viewed from the top. Here, the common region S, where the first circuit element 30 and the second circuit element 50 are the closest to each other in the vertical (up-and-down) direction as shown in FIG. 1, is where the circuit elements are the most vulnerable to the effects of noise. It should be noted that according to the first embodiment of the present invention, the second circuit element 50 has dimensions smaller than those of the first circuit element 30 and the whole of the second circuit element 50 overlaps the first circuit element 30. Consequently, the common area S in the first embodiment is equal to the dimensions (placement area) of the second circuit element 50, and the antenna conductor 3a is disposed with its outer periphery located outside the outer periphery of the second circuit element 50.

It is to be noted that the first circuit element 30 is an example of "first circuit element" of the present invention, the antenna conductor 3a an example of "conductor" thereof, the second circuit element 50 an example of "second circuit element" thereof, the passive element 40 an example of "passive element" thereof, and the common area S an example of "common area" thereof.

Hereinbelow, the control of noise propagation by the antenna conductor 3a is explained.

Where an antenna conductor 3a implementing the above-described structure is interposed between the stacked circuit elements, the antenna conductor 3a functions as a loop antenna, which absorbs electromagnetic energy released as noise from the circuit elements. That is, the magnetic fields (magnetic fluxes) crisscrossing the antenna conductor 3a cause induced currents to flow therein, and the induced currents are consumed as they are converted into the Joule heat by the internal resistance of the antenna conductor 3a and the resistive part of the passive element 40. In this manner, the noise propagation is interrupted by the antenna conductor 3a interposed between the circuit elements.

Figure 5:
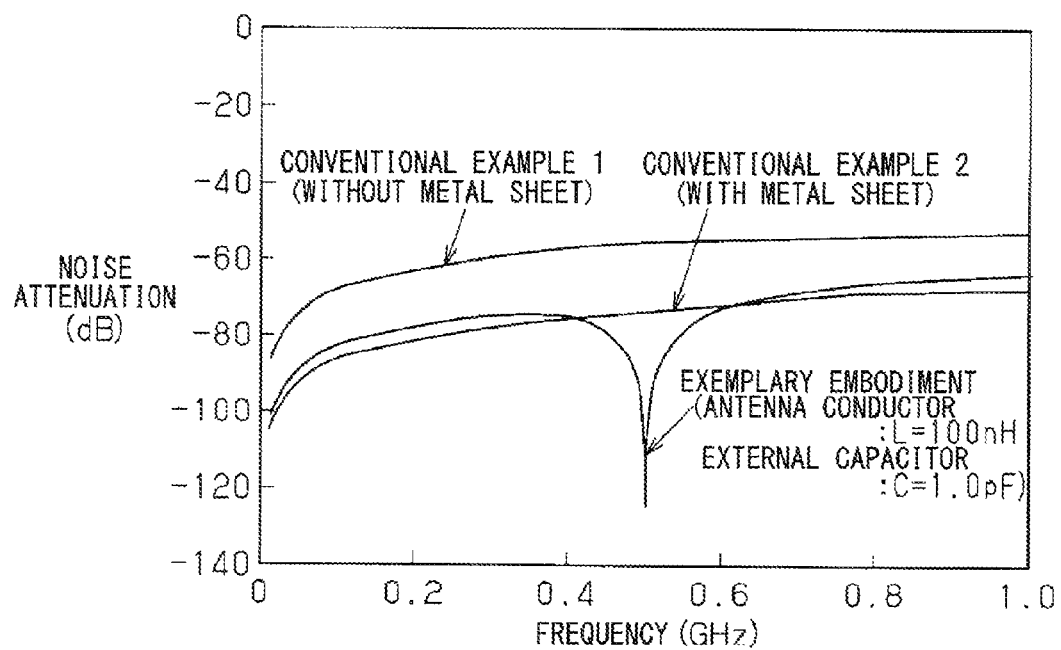
FIG. 5 shows simulation outcomes on noise attenuance in an antenna conductor.

FIG. 5 shows the results of simulation runs on noise attenuance performed to confirm the effectiveness of noise propagation control between the circuit elements according to the present embodiment. Shown in FIG. 5 are conventional example 1 (no metallic plate or antenna conductor interposed between the circuit elements) and conventional example 2 (a metallic plate held at ground potential interposed between the circuit elements) in comparison with the results of this exemplary embodiment (an antenna conductor coupled to an external capacitor interposed between the circuit elements). Note that in the exemplary embodiment, the inductance value (L) employed for the antenna conductor is 100 nH, and the capacitance value (C) for the external capacitor is 1.0 pF.

As is evident in FIG. 5, the exemplary embodiment, with the interposed antenna conductor, displays a generally improved noise attenuance in comparison with conventional example 1. This provides proof that the antenna conductor interposed between the circuit elements is effective in suppressing noise propagation. Also, the exemplary embodiment shows a selectiveness of the noise attenuance relative to frequency; that is, it displays noise attenuance further improved over that of conventional example 2 in a specific frequency domain.

Figure 6:
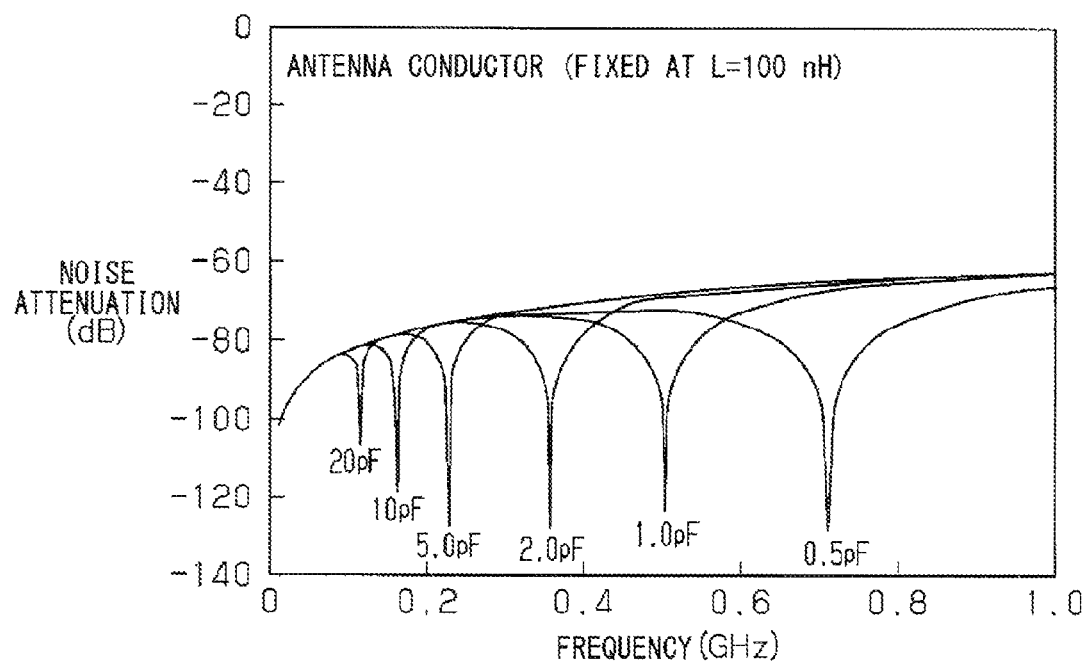
FIG. 6 shows simulation outcomes on noise attenuance by changing the capacitance value of an external capacitor.

FIG. 6 shows the results of simulation runs on noise attenuance by changing the capacitance value of the external capacitor. They are the outcomes obtained when the inductance value (L) of the antenna conductor is fixed at 100 nH, and the capacitance value (C) of the external capacitor connected to the antenna conductor is varied within a range of 0.5 pF to 20 pF.

As shown in FIG. 6, varying the capacitance value of the external capacitor results in increases in noise attenuance in a number of specific frequency domains corresponding to the respective capacitance values. These specific frequencies are resonance frequencies that are determined by a constant value of the antenna conductor and capacitor, and it is found that noise propagation is effectively attenuated at these resonance frequencies and their neighboring domains.

As described above, an antenna conductor (including the capacitor) interposed between the circuit elements can suppress the noise propagation therebetween. Further, the noise propagation between the circuit elements will be more effectively and reliably controlled if the above-described resonance frequencies are matched with the frequencies of noise (noise arising from the circuit elements) that are to be absorbed.

(Manufacturing Method)

FIGS. 7A to 7G are a set of cross-sectional views for explaining a method for forming an interposer board according to the first embodiment of the present invention. FIGS. 8A to 8E are a set of cross-sectional views for explaining a manufacturing process of a semiconductor module according to the first embodiment.

Figure 7A:
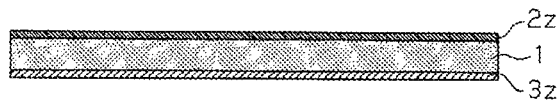
FIGS. 7A to 7G are a set of cross-sectional views for explaining a method for forming an interposer board according to a first embodiment of the present invention.

Firstly, as illustrated in FIG. 7A, a sheet, which is comprised of an insulating resin layer 1 with a first copper foil 2z formed on the upper face thereof and a second copper foil 3z formed on the lower face thereof, is prepared.

Figure 7B:
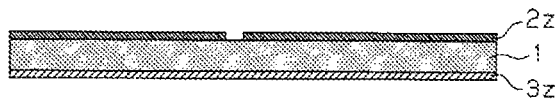

As illustrated in FIG. 7B, a portion of the first copper foil 2z corresponding to the formation of a via-hole 1a (see FIG. 1) is removed, using a lithography technique and etching technique. This exposes an area on the insulating resin layer 1 where the via-hole 1a is to be formed therein.

Figure 7C:
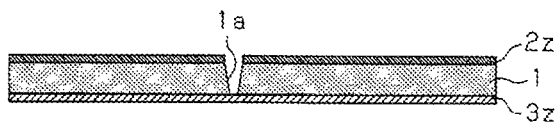

As illustrated in FIG. 7C, the portion covering from the exposed upper face (surface) of the insulating resin layer 1 to the lower face thereof where it reaches the second copper foil 3z is removed by irradiating carbon dioxide gas laser or UV laser from above the first copper foil 2z. Here the second copper foil 3z functions as a stopper layer. In this manner, the via-hole 1a penetrating the insulating resin layer 1 is formed.

Figure 7D:
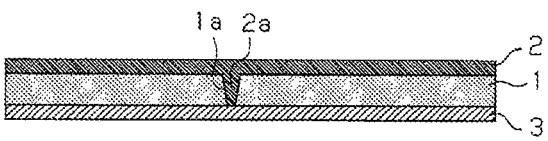

As illustrated in FIG. 7D, the surface of the first copper foil 2z and the inside surface of the via-hole 1a are plated with copper (Cu), using an electroless plating method. Then the surface of the first copper foil 2z and the inside of the via-hole 1a are plated with copper (Cu), using an electrolytic plating method. Note that in this embodiment, addition of a suppressor and an accelerator in the plating solution causes the adsorption of the suppressor on the surface of the first copper foil 2z and the adsorption of the accelerator on the inside surface of the via-hole 1a. This contributes to making the copper plating on the inside surface of the via-hole 1a thicker, thus allowing copper to fill up the via-hole 1a. As a result, a copper plating layer 2 is formed on the insulating resin layer 1 and at the same time a via-plug 2a is formed within the via-hole 1a as shown in FIG. 7D. Also, in this series of plating processings, a copper plating layer 3 is formed, in a similar manner, on the second copper foil 3z on the underside of the insulating resin layer 1.

Figure 7E:
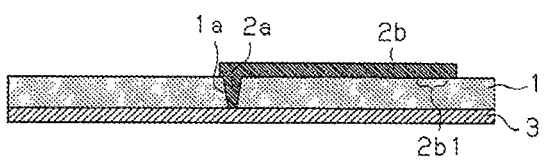

As illustrated in FIG. 7E, the copper plating layer 2 is patterned using a lithography technique and an etching technique. In carrying out this process, a protection is given to the copper plating layer 3 by forming a resist protection film (not shown) on the underside. Thereby, a wiring layer 2b with a wiring pattern including bridge line and pad electrode 2b1 is formed.

Figure 7F:
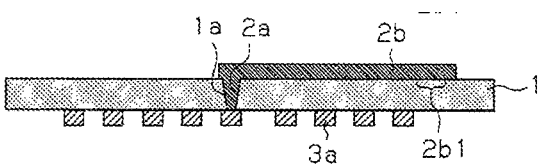

As illustrated in FIG. 7F, the copper plating layer 3 on the underside is patterned using a lithography technique and an etching technique. In carrying out this process, a protection is given to the wiring layer 2b by forming a resist protection film (not shown) on the upper side. Thereby, a spiral-shaped antenna conductor 3a as shown in FIG. 4 is formed.

Figure 7G:
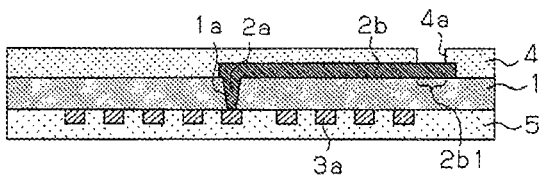

As illustrated in FIG. 7G, a solder resist layer 4 having an opening 4a in a position corresponding to the pad electrode 2b1 of the wiring layer 2b is formed in such a manner as to cover the insulating resin layer 1 and the wiring layer 2b on the upper side. Further, the solder resist layer 5 is formed in such a manner as to cover the insulating resin layer 1 and the antenna conductor 3a on the underside. Note that the solder resist layer 4 and the solder resist layer 5 have the function of protecting the wiring layer 2b and the antenna conductor 3a, respectively.

An interposer board 10 to be manufactured as described above is prepared separately, and it is used in the manufacturing process of a semiconductor module according to the first embodiment, which will be explained hereinbelow.

Figure 8A:
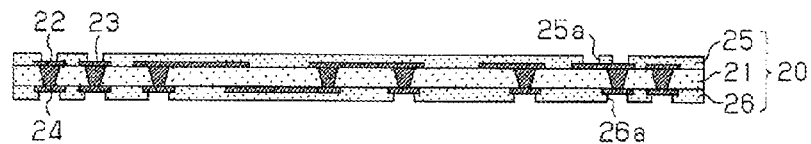
FIGS. 8A to 8E are a set of cross-sectional views for explaining a manufacturing process of a semiconductor module according to a first embodiment of the present invention.

Firstly, as illustrated in FIG. 8A, a multilayer board 20 of two-layer wiring structure is prepared. This multilayer board 20 is composed, from top to bottom, of a solder resist layer 25, a wiring layer 22, an insulating layer 21 including via-plugs 23, a wiring layer 24, and a solder resist layer 26. And it can be manufactured, for instance, by the same method as for the interposer board 10. Note that the solder resist layer 25 has openings 25a in positions thereof corresponding to predetermined pad electrodes and the solder resist layer 26 has openings 26a in positions thereof corresponding to predetermined external connection electrodes (solder balls) 80.

Figure 8B:
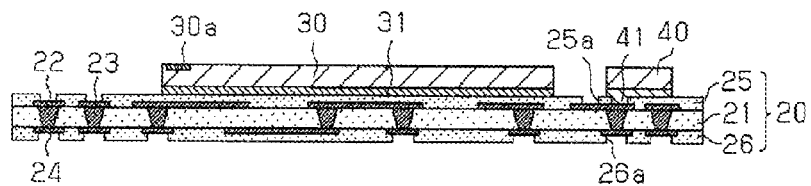

As illustrated in FIG. 8B, a first circuit element 30 having pad electrodes 30a on the upper face (surface) of the outer periphery thereof is mounted in a predetermined region on a multilayer board 20 through the medium of adhesive 31, such as a die-attach film. Here, the first circuit element 30 employed is, for example, a circuit element with a digital circuit formed on the surface thereof. Following this, a passive element 40, which is a capacitor of a predetermined capacitance value, is mounted in a predetermined region on the multilayer board 20. The passive element 40 is electrically connected to the pad electrodes of a wiring layer 22 provided on the upper face of the multilayer board 20 through the medium of conductive adhesive 41, such as silver (Ag) paste.

Figure 8C:
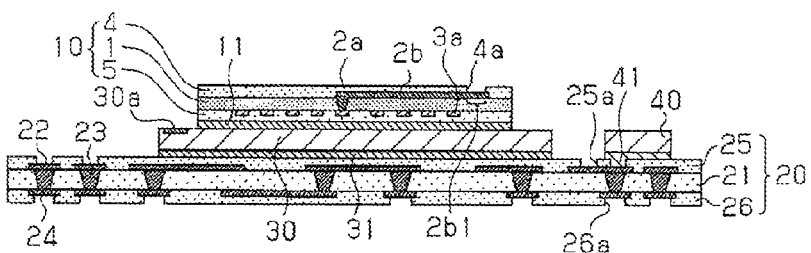

As illustrated in FIG. 8C, an interposer board 10 having an antenna conductor 3a is superposed in a predetermined region on the first circuit element 30 through the medium of adhesive 11, such as a die-attach film. The method for forming the interposer board 10 having the antenna conductor 3a is as described previously.

Figure 8D:
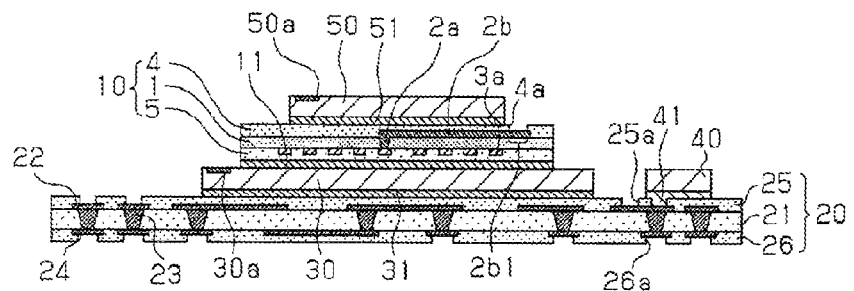

As illustrated in FIG. 8D, a second circuit element 50 having pad electrodes 50a on the upper face (surface) of the outer periphery thereof is mounted in a predetermined region on the interposer board 10 through the medium of adhesive 51, such as a die-attach film. Here, the second circuit element 50 employed is, for example, a circuit element with an analog circuit formed on the surface thereof. Note that the dimensions of the second circuit element 50 are smaller than those of the first circuit element 30, and the whole of the second circuit element 50 is superposed above the first circuit element 30. And, at the same time, the antenna conductor 3a in the interposer board 10 is so disposed that the outer perimeter thereof is larger than the outer perimeter of the second circuit element 50.

Figure 8E:
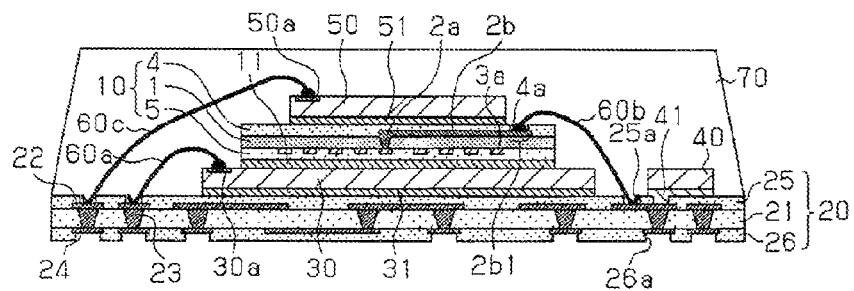

As illustrated in FIG. 8E, the pad electrodes 30a of the first circuit element 30, the pad electrodes 2b1 of the interposer board 10, and the pad electrodes 50a of the second circuit element 50 are electrically connected to the correspondingly provided pad electrodes of the wiring layer 22 provided on the upper face of the multilayer board 20 via bonding wires 60a, 60b and 60c of gold or the like, respectively. As a result, the antenna conductor 3a in the interposer board 10 is connected to the passive element 40 and thus can function as a loop antenna with the passive element 40 interposed therein. Following this, a molded resin layer 70 is formed in such a manner as to cover the whole area above the multilayer board 20 in order to protect the first circuit element 30, the interposer board 10, the passive element 40 and the second circuit element 50 which are disposed on the multilayer board 20.

Finally, as illustrated in FIG. 1, external connection electrodes (solder balls) 80, which function as external connection terminals, are formed on the wiring layer 24 in the parts exposed by openings 26a in the solder resist layer 26, using a solder printing method.

Through these processes, a semiconductor module according to the first embodiment, as shown in FIG. 1, is manufactured.

The semiconductor module according to the first embodiment provides the following advantageous effects among others:

(1) The antenna conductor 3a interposed between the first circuit element 30 and the second circuit element 50 functions as a loop antenna, which intercepts or shield noise propagation between the two circuit elements by absorbing it. This contributes to stabilizing the operation of the semiconductor module, thus improving the reliability thereof.

(2) The antenna conductor 3a, which is disposed in such superposition as to cover the common region S where the first circuit element 30 and the second circuit element 50 overlap as viewed from top, effectively absorbs and thereby shields the noise arising from each of the circuit elements by absorbing the noise more reliably. Here, the common region S is where the first circuit element 30 and the second circuit element 50 are the closest to each other in the vertical (up-and-down) direction and therefore the circuit elements are the most vulnerable to the effects of noise.

(3) The antenna conductor 3a so disposed that the outer edge thereof is larger than the outer edge of the second circuit element 50 can radiate heat from the part thereof outside the outer edge of the second circuit element 50. This effectively reduces the temperature rise in the antenna conductor 3a which results from the absorption of noise. Consequently, the performance characteristics of the antenna conductor 3a as a loop antenna are stabilized, thus allowing it to stably shield noise propagation between the circuit elements.

(4) A passive element 40 is connected to the feeding point of the loop antenna constituted by the antenna conductor 3a. Thus, the frequencies or the frequency bands of the noise to be shielded as a result of the absorption can be adjusted by controlling the characteristics of the passive element 40 connected to the antenna conductor 3a. This allows the reduction of noise propagation more effectively.

(5) The frequency (resonance frequency) which is determined by the resonance between the antenna conductor 3a and the passive element 40 is so chosen as to be equal to the frequency of noise from the circuit elements. This arrangement makes sure that the noise propagation between the circuit elements is reduced reliably.

Second Embodiment

Figure 9:
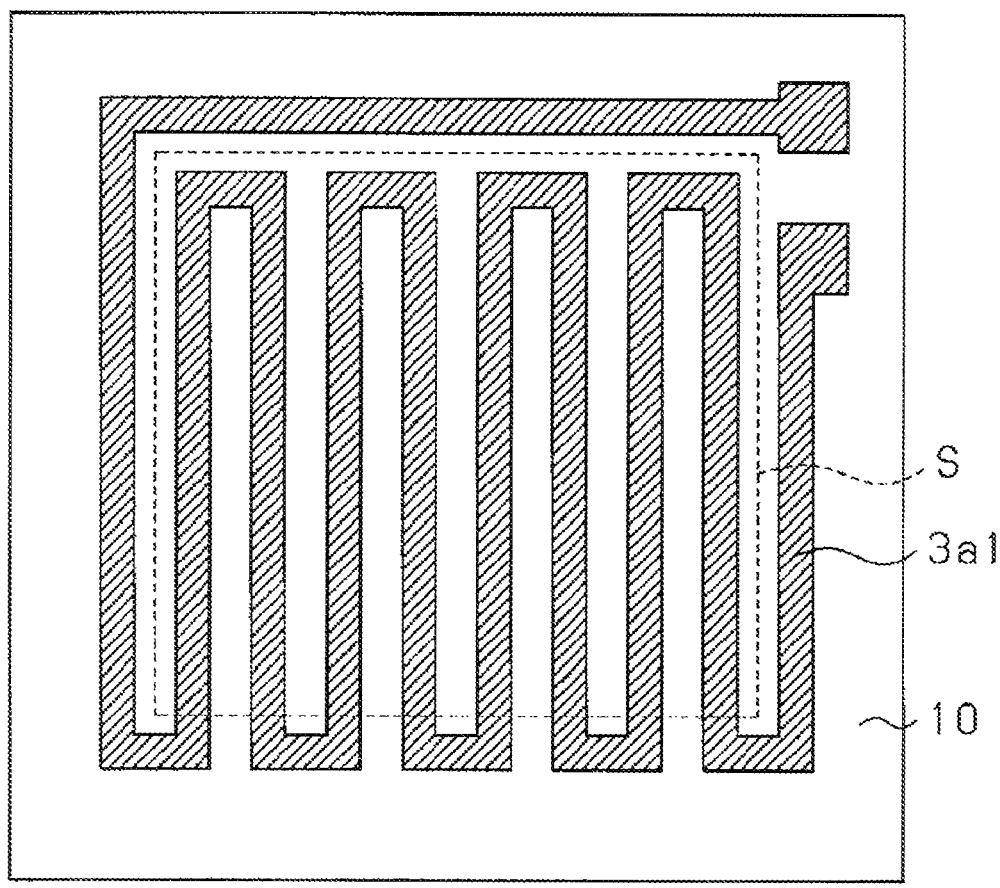
FIG. 9 is a layout plan of an antenna conductor in an interposer board in a second embodiment of the present invention.

FIG. 9 is a layout plan of an antenna conductor in an interposer board according to a second embodiment of the present invention. The difference from the first embodiment lies in that the antenna conductor 3a1 in the interposer board 10 is in a meandering-shaped wiring pattern instead of a spiral-shaped one. Similarly to the first embodiment, the outer perimeter (dimensions) of the antenna conductor 3a1 is formed larger than the outer perimeter (dimensions) of the common region S (the region enclosed by a broken line) where the first circuit element 30 and the second circuit element 50 overlap as viewed from top, and the antenna conductor 3a1 is disposed in such a manner as to cover the whole of the common region S. Otherwise, the second embodiment has the same features as the first embodiment. Note that the antenna conductor 3a1 is an example of "conductor" of the present invention.

The interposer board 10 having an antenna conductor 3a1 such as described above may be manufactured by a generally known manufacturing method of a single-layer wiring board.

A semiconductor module according to the second embodiment may provide the following advantageous effects in addition to the aforementioned ones (1) to (5):

(6) The meandering-shaped wiring pattern for the antenna conductor 3a1 makes it unnecessary to use the wiring layer 2b which includes the via-plug 2a and bridge line for leading out the ends of the antenna conductor 3a of the first embodiment. Thus the interposer board 10 may be structured in a single-layer wiring board. As a result, the interposer board 10 may be formed thinner, which contributes to making a semiconductor module incorporating it thinner.

(7) The meandering-shaped wiring pattern for the antenna conductor 3a1 makes it possible to form the interposer board 10 in a single-layer wiring board, which can reduce the manufacturing man-hours. As a result, the manufacturing cost of a semiconductor module can be reduced.

Third Embodiment

Figure 10:
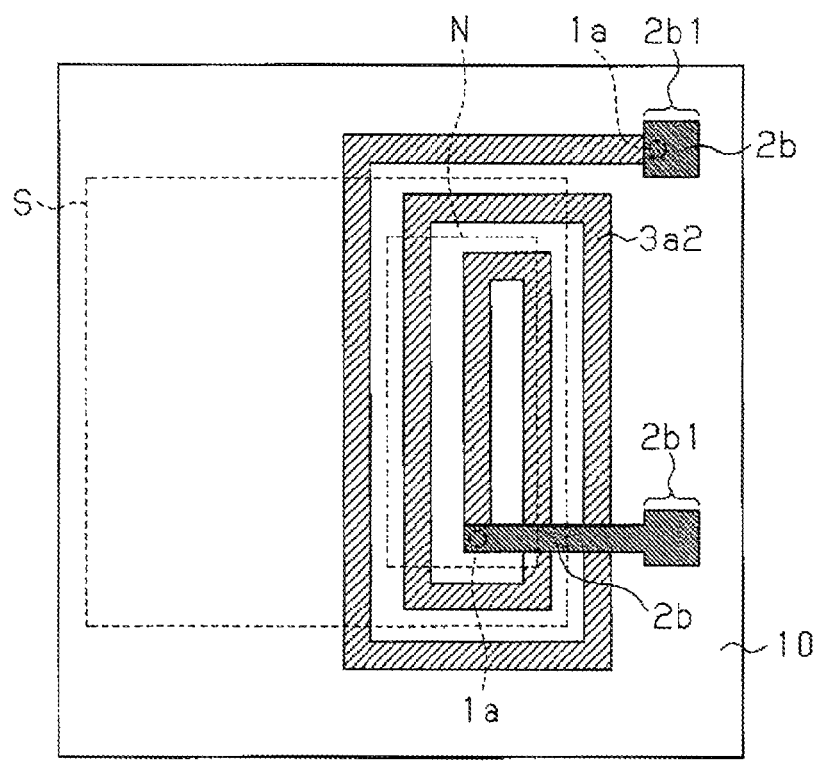
FIG. 10 is a layout plan of an antenna conductor in an interposer board in a third embodiment of the present invention.

FIG. 10 is a layout plan of an antenna conductor in an interposer board according to a third embodiment of the present invention. The difference from the first embodiment lies in that the antenna conductor 3a2 in the interposer board 10 is disposed in such superposition as to selectively cover a noise-producing circuit region N (the region enclosed by a broken line in FIG. 10), which is on at least one partial side of the first circuit element 30 and the second circuit element 50 within the common region S. Otherwise, the third embodiment has the same features as the first embodiment. Note that the antenna conductor 3a2 is an example of "conductor" of the present invention, and the circuit region N an example of "circuit region".

An antenna conductor 3a2 such as described above can be manufactured easily by changing the layout in a patterning process of a copper plating layer 3 as shown in FIG. 7F.

A semiconductor module according to the third embodiment may provide the following advantageous effects in addition to the aforementioned ones (1), (4), and (5):

(8) The antenna conductor 3a2 disposed in such superposition as to selectively cover a noise-producing circuit region N, which is on at least one partial side of the first circuit element 30 and the second circuit element 50, can reliably shield noise propagation from the circuit elements having the circuit region N because the noise-producing circuit region N capable of causing adverse effects is selectively covered by the antenna conductor 3a2.

Fourth Embodiment

Figure 11:
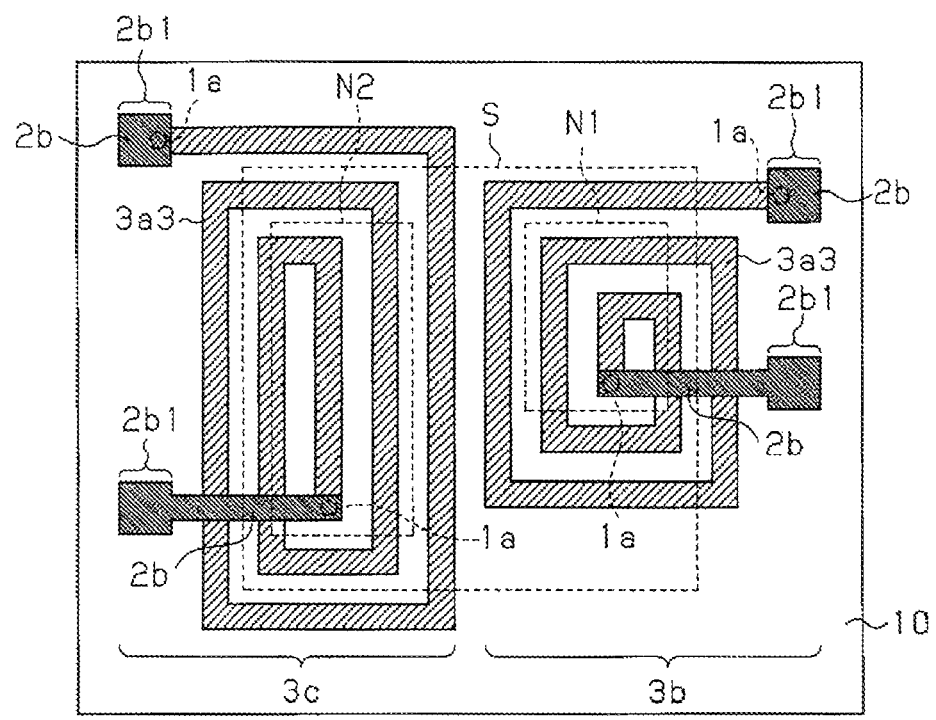
FIG. 11 is a layout plan of an antenna conductor in an interposer board in a fourth embodiment of the present invention.

FIG. 11 is a layout plan of an antenna conductor in an interposer board according to a fourth embodiment of the present invention. The difference from the first embodiment lies in that there are a plurality of noise-producing circuit regions, which are each on at least one partial side of the first circuit element 30 and the second circuit element 50 within the common region S and the noise-producing circuit regions include a first circuit region N1 and a second circuit region N2 provided in a position different from the first circuit region N1. Further, the difference also lies in that an antenna conductor 3a3 is comprised of a first antenna conductor 3b, which is so superposed as to cover the first circuit region N1 to function as a first loop antenna, and a second antenna conductor 3c, which is so superposed as to cover the second circuit region N2 to function as a second loop antenna. Otherwise, the fourth embodiment has the same features as the first embodiment. Note that the first circuit region N1 is an example of "first region" of the present invention, the second circuit region N2 an example of "second region", the antenna conductor 3a3 an example of "conductor", the first antenna conductor 3b an example of "first conductor", and the second antenna conductor 3c an example of "second conductor".

An antenna conductor 3a3 such as described above may be manufactured easily by changing the layout of related parts in a manufacturing process of the interposer board 10.

A semiconductor module according to the fourth embodiment may provide the following advantageous effects in addition to the aforementioned ones (1), (4), (5), and (8):

(9) The arrangement according to this embodiment is such that the noise-producing circuit regions within the common region S include the first circuit region N1 and the second circuit region N2 provided in a position different from the first circuit region N1, and the antenna conductor 3a3 is comprised of the first antenna conductor 3b, which is so superposed as to cover the first circuit region N1 to function as a first loop antenna, and the second antenna conductor 3c, which is so superposed as to cover the second circuit region N2 to function as a second loop antenna. And this arrangement makes it possible to effectively shield noise propagation between the circuit elements because the frequencies or frequency bands of noise can be adjusted for each of the noise-producing regions of the circuit elements.

Fifth Embodiment

Figure 12:
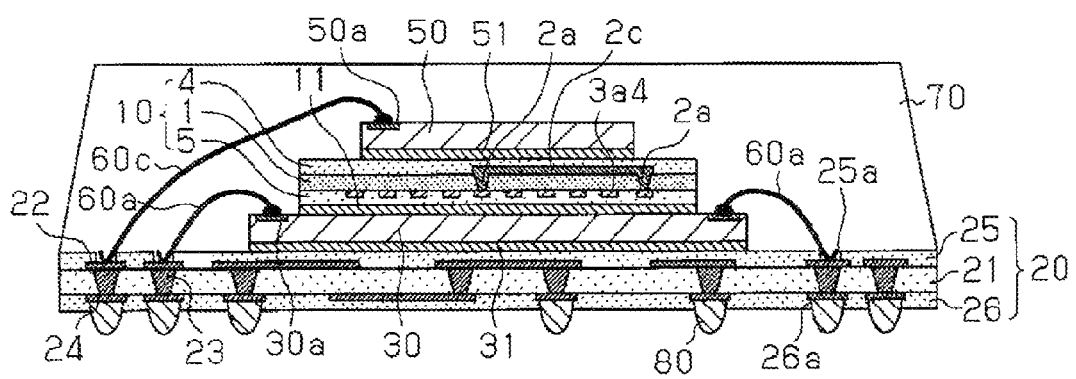
FIG. 12 is a cross-sectional view showing a structure of a semiconductor module according to a fifth embodiment of the present invention.
Figure 13:
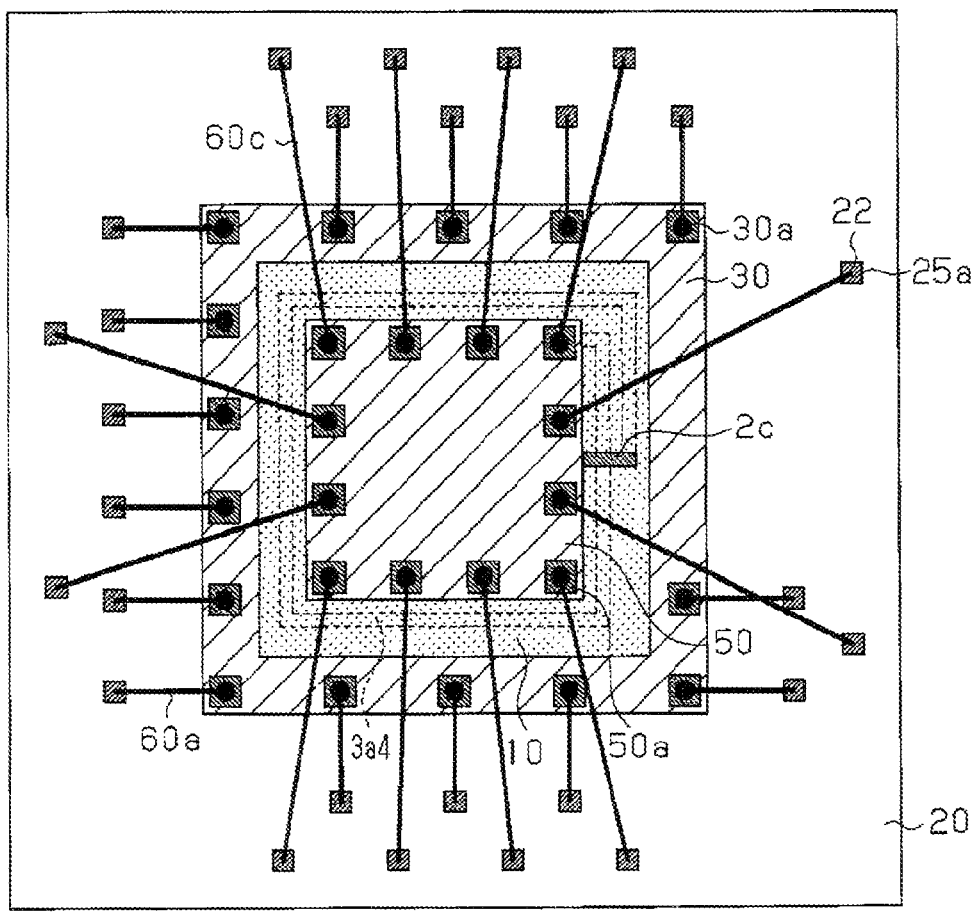
FIG. 13 is a plan view of a semiconductor module according to a fifth embodiment of the present invention.
Figure 14:
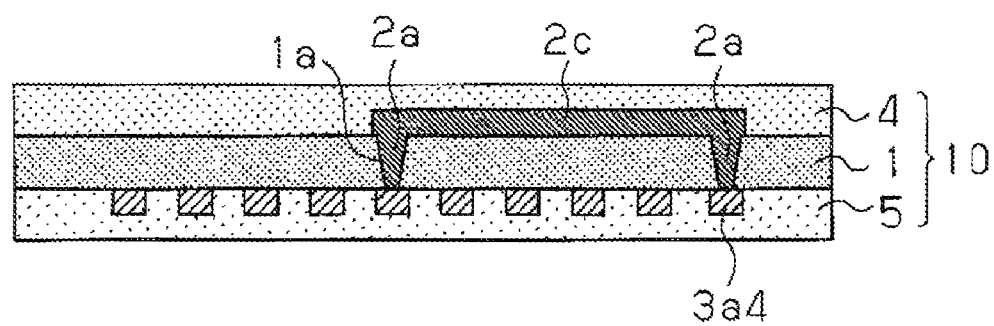
FIG. 14 is a cross-sectional view showing a structure of an interposer board in a fifth embodiment of the present invention.
Figure 15:
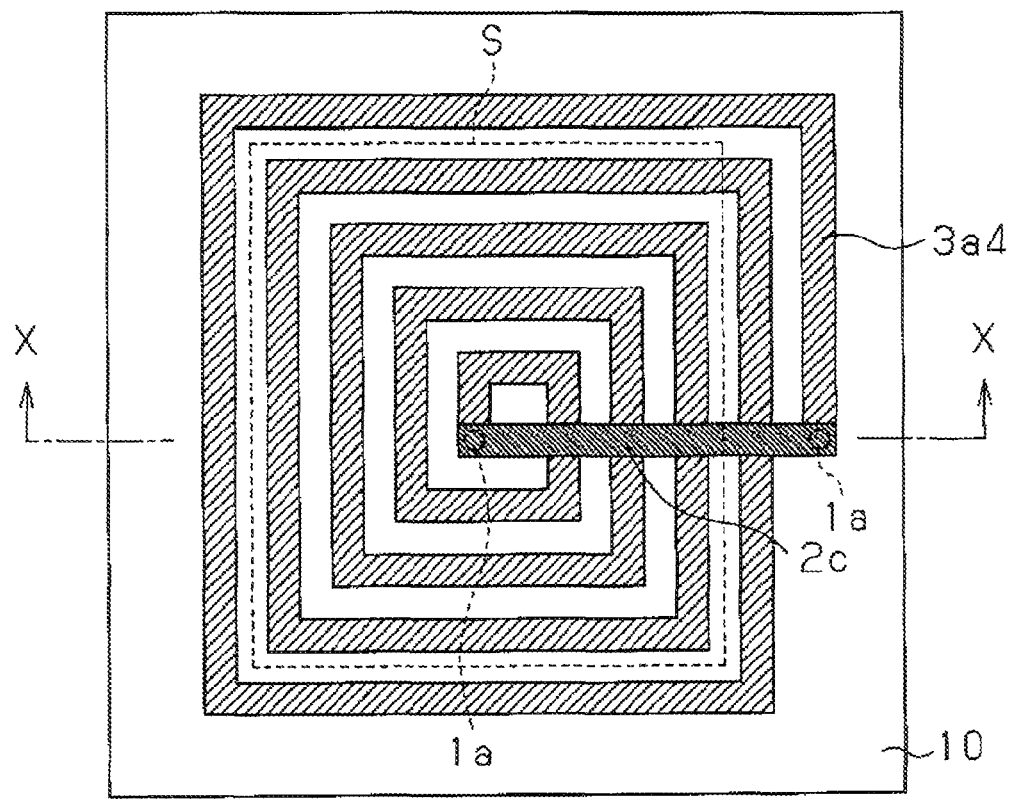
FIG. 15 is a layout plan of an antenna conductor in an interposer board in a fifth embodiment of the present invention.

FIG. 12 is a cross-sectional view showing a structure of a semiconductor module according to a fifth embodiment of the present invention. FIG. 13 is a plan view (top view) of a semiconductor module according to the fifth embodiment. FIG. 14 is a cross-sectional view showing a structure of an interposer board according to the fifth embodiment. FIG. 15 is a layout plan of an antenna conductor in the interposer board. Note that FIG. 14 is equal to a cross section taken along line X-X of FIG. 15.

The semiconductor module according to the fifth embodiment includes a multilayer board 20, a first circuit element 30 mounted on the multilayer board 20, a second circuit element 50 stacked above the first circuit element 30, an interposer board 10, including an antenna conductor 3a4, which is disposed between the first circuit element 30 and the second circuit element 50, and a molded resin layer 70 sealing the respective elements. The difference from the first embodiment lies in that no passive element 40 is connected to the antenna conductor 3a4 in the interposer board 10 and that an annular conductor, which is constituted by the antenna conductor 3a4 and a wiring layer 2c, functions as a loop antenna. Otherwise, the fifth embodiment has the same features as the first embodiment. Note that the antenna conductor 3a4 is an example of "conductor" of the present invention.

Specifically, as illustrated in FIG. 14, the interposer board 10 according to the fifth embodiment is structured with, from top down, a solder resist layer 4, a wiring layer 2c, an insulating resin layer 1 including via-plugs 2a, an antenna conductor 3a4, and a solder resist layer 5. On the upper face of the insulating resin layer 1, the wiring layer 2c, which includes a bridge line, is formed, and the solder resist layer 4 is formed over this wiring layer 2c. On the lower face of the insulating resin layer 1, on the other hand, the antenna conductor 3a4 is formed, and the solder resist layer 5 is formed over the antenna conductor 3a4. Further, the wiring layer 2c and the antenna conductor 3a4 are electrically connected with each other by the via-plugs 2a which penetrate the insulating resin layer 1. Note that the materials employed for the parts of the interposer board 10 of the fifth embodiment may be the same as for one used in the first embodiment.

The antenna conductor 3a4, as shown in FIG. 15, is comprised of a spiral-shaped wiring pattern, and both ends thereof are connected by the wiring layer 2c through the via-plugs 2a and the bridge line. Structured as described above, the antenna conductor 3a4 becomes an annular conductor and functions as a loop antenna without feeding points. The loop antenna without feeding points correspond to a state where the two feeding points in the first embodiment are connected by the wiring layer 2c and thus disappear by being distributed throughout the antenna conductor 3a4. Accordingly, where an antenna conductor 3a4 implementing the above-described structure is interposed between the two stacked circuit elements, the antenna conductor 3a4 functions as a loop antenna, which absorbs electromagnetic energy released as noise from the circuit elements. That is, the magnetic fields (magnetic fluxes) crisscrossing the antenna conductor 3a4 cause induced currents to flow therein, and the induced currents are consumed as they are converted into the Joule heat by the internal resistance of the antenna conductor 3a4. Thus, with the semiconductor module according to the fifth embodiment, the antenna conductor 3a4 interposed between the circuit elements shields the noise propagation. Note that in this fifth embodiment, the noise propagation is effectively reduced at the self-resonance frequencies and their neighborhoods of the antenna conductor 3a4.

The outer perimeter (dimensions) of the antenna conductor 3a4, as shown in FIG. 15, is formed larger than the outer perimeter (dimensions) of the common region S (the region enclosed by a broken line in FIG. 15) where the first circuit element 30 and the second circuit element 50 overlap as viewed from top, and the antenna conductor 3a4 is superposed in such a manner as to cover the whole of the common region S.

An antenna conductor 3a4 such as described above can be manufactured easily by changing the layout of related parts in a manufacturing process of the interposer board 10.

A semiconductor module according to the fifth embodiment may provide the following advantageous effects in addition to the aforementioned ones (1) to (3):

(10) The noise propagation between the circuit elements will be more effectively and reliably controlled if the frequencies (self-resonant frequencies) determined by the resonance of the loop antenna of the antenna conductor 3a4 are matched with the frequencies of noise arising from the circuit elements.

(11) The antenna conductor 3a4 functions as a loop antenna with the structure of the interposer board 10 alone without any external connection. This arrangement makes it unnecessary to use the passive element 40 and the pad electrodes and bonding wires 60b related thereto. This, in turn, makes it possible to make the semiconductor module correspondingly smaller and reduce the manufacturing cost thereof.

Sixth Embodiment

Figure 16:
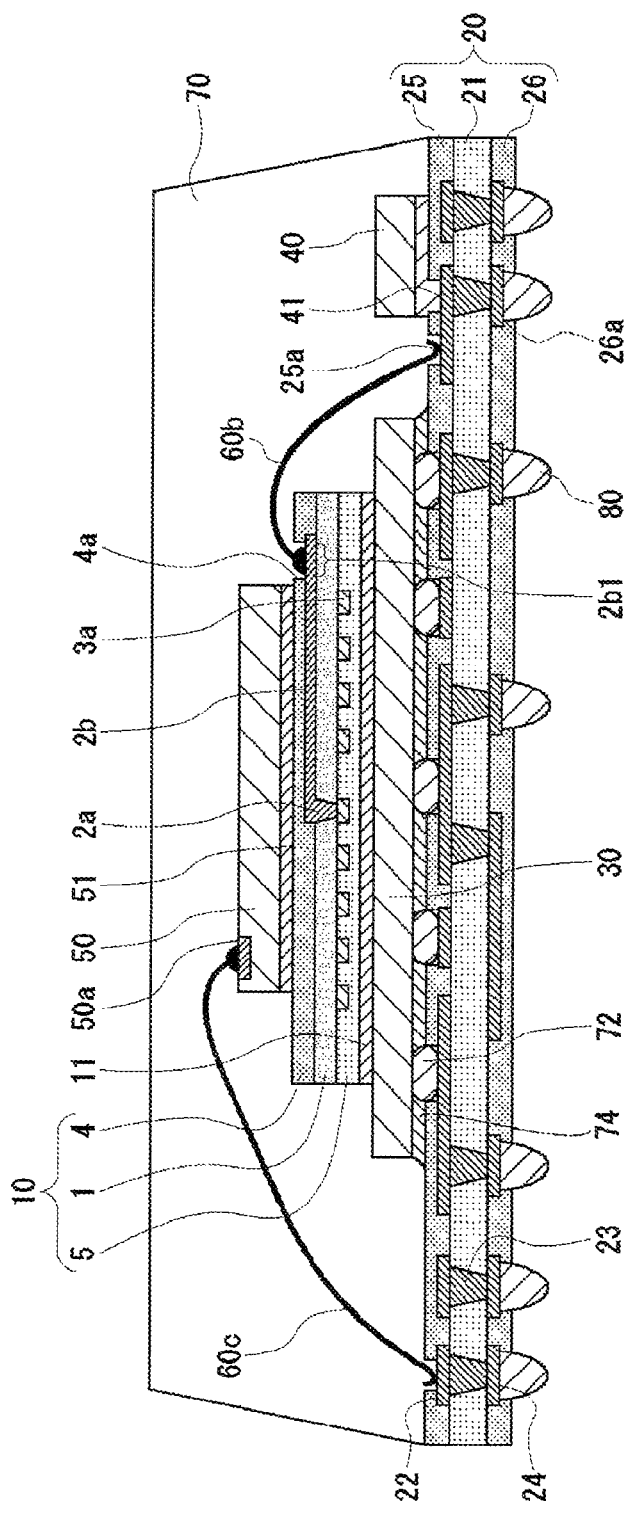
FIG. 16 is a cross-sectional view showing a structure of a semiconductor module according to a sixth embodiment of the present invention.

FIG. 16 is a cross-sectional view showing a structure of a semiconductor module according to a sixth embodiment of the present invention.

The semiconductor module according to the sixth embodiment includes a multilayer board 20, a first circuit element 30 mounted on the multilayer board 20, a second circuit element 50 stacked above the first circuit element 30, an interposer board 10, including an antenna conductor 3a, which is disposed between the first circuit element 30 and the second circuit element 50, a passive element 40 mounted on the multilayer board 20 and connected to the antenna conductor 3a, and a molded resin layer 70 sealing the respective elements.

The semiconductor module of the sixth embodiment differs from that of the first embodiment lies in that the multilayer board 20 and the first circuit element 30 are connected together through the medium of a bump (bump electrode) 72, namely, the so-called flip chip packaging is implemented. In order to strengthen a connection part between the first circuit element and the multilayer board, an underfill material 74 is filled in between the first circuit element 30 and the multilayer board 20.

A semiconductor module according to the sixth embodiment may provide the advantageous effects described in the above (1) to (3).

Seventh Embodiment

Figure 17:
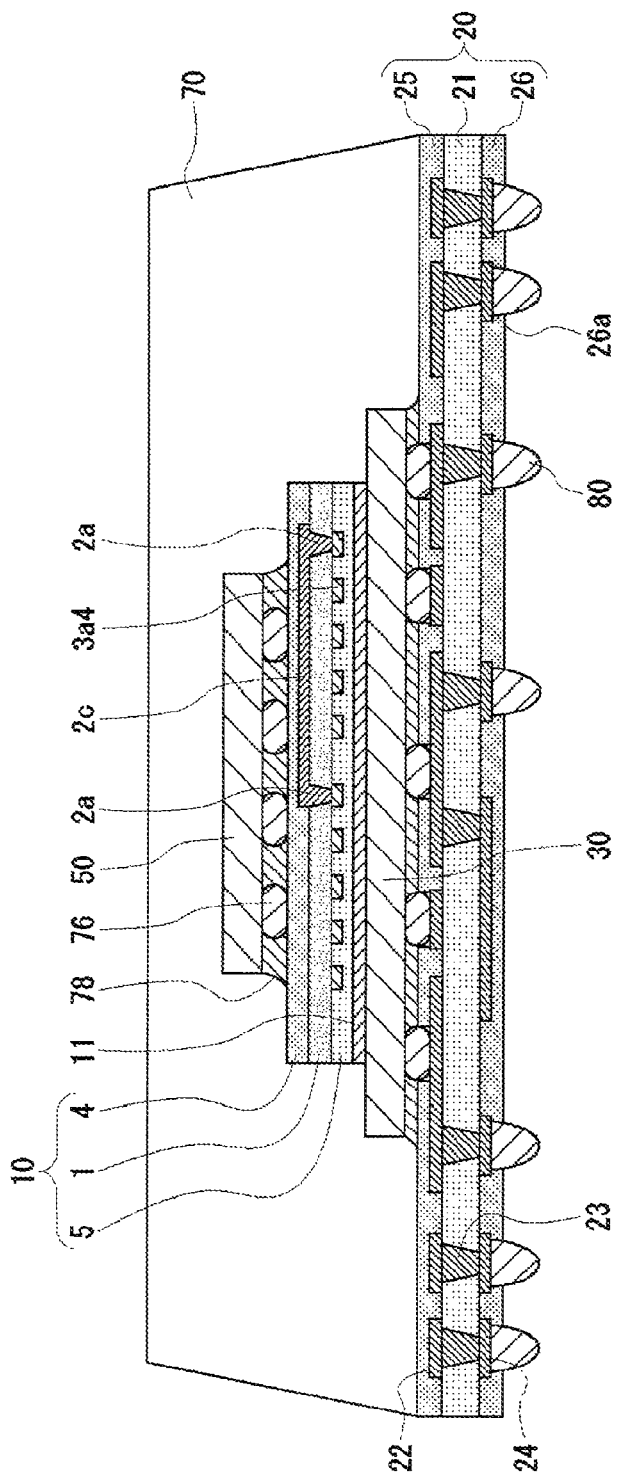
FIG. 17 is a cross-sectional view showing a structure of a semiconductor module according to a seventh embodiment of the present invention.

FIG. 17 is a cross-sectional view showing a structure of a semiconductor module according to a seventh embodiment of the present invention.

The semiconductor module according to the seventh embodiment includes a multilayer board 20, a first circuit element 30 mounted on the multilayer board 20, a second circuit element 50 stacked above the first circuit element 30, an interposer board 10, including an antenna conductor 3a4, which is disposed between the first circuit element 30 and the second circuit element 50, and a molded resin layer 70 sealing the respective elements.

The difference from the sixth embodiment lies in that no passive element 40 is connected to the antenna conductor 3a4 in the interposer board 10 and that an annular conductor, which is constituted by the antenna conductor 3a4 and a wiring layer 2c, functions as a loop antenna. The difference also lies in that the interposer board 10 and the second circuit element 50 are connected together through the medium of a bump (bump electrode) 76, namely, the so-called flip chip packaging is implemented.

In order to strengthen a connection part between the interposer board 10 and the second circuit element 50, an underfill material 78 is filled in between the interposer board 10 and the second circuit element 50, in the seventh embodiment. Otherwise, the seventh embodiment has the same features as the first embodiment. Since the antenna conductor 3a4 is structured the same way as in the first embodiment, its detail is omitted here.

A semiconductor module according to the seventh embodiment may provide the advantageous effects described in the above (1) to (3), (10) and (11).

Eighth Embodiment

Figure 18:
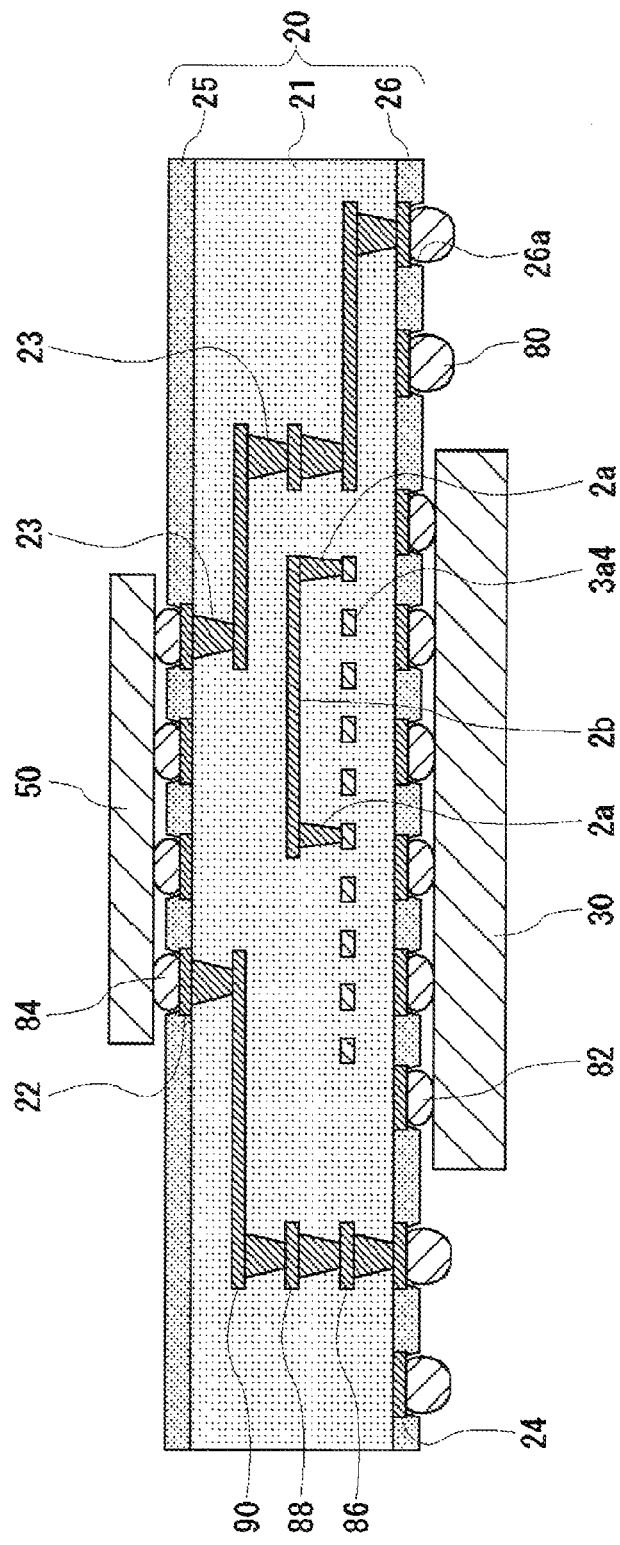
FIG. 18 is a cross-sectional view showing a structure of a semiconductor module according to an eighth embodiment of the present invention.

FIG. 18 is a cross-sectional view showing a structure of a semiconductor module according to an eighth embodiment of the present invention.

The semiconductor module according to the eighth embodiment includes a multilayer board 20, a first circuit mounted on one face of the multilayer board 20, and a second circuit element 50 mounted on the other face of the multilayer board 20.

The multilayer board 20, which is, for instance, a base board of five-layer wiring structure, has a wiring layer 22 and a wiring layer 24 on the upper face and the lower face thereof, respectively, with an insulating layer 21 disposed in between. The insulating layer 21 has wiring layers 86, 88 and 90 therein, and these wiring layers are electrically connected to each other by a via-plug 23. The insulating layer 21 is formed of, for instance, an epoxy resin, whereas the wiring layer 22, the wiring layer 24 and the via-plug 23 are formed of, for instance, copper (Cu). Also, formed on the bottom face of the multilayer board 20 are a plurality of external connection electrodes (solder balls) 80 which are connected to the wiring layer 24.

The first circuit element 30 is, for instance, a so-called BGA (Ball Grid Array) type circuit element where a digital circuit is stored therein and, on the upper face thereof, ball-shaped bumps 82 are arranged in grids. And the first circuit element 30 is mounted in a predetermined region of the lower face of the multilayer board 20 through the medium of the bumps 82.

The second circuit element 50 is, for instance, a circuit element where an analog circuit is stored therein and, on the lower face thereof, ball-shaped bumps 84 are arranged in grids. And the second circuit element 50 is mounted in a predetermined region of the upper face of the multilayer board 20 through the medium of the bumps 84. The dimensions of the second circuit element 50 are smaller than those of the first circuit element 30, and the whole of the second circuit element 50 is superposed on the first circuit element 30.

The multilayer board 20 includes an antenna conductor 3a4 which functions as a loop antenna where part of a wiring layer inside is patterned. Note that the eighth embodiment differs from the fifth embodiment in that the antenna conductor 3a4 according to the eighth embodiment is provided inside the multilayer board 20 instead of being provided inside the interposer board 10.

A semiconductor module according to the eighth embodiment may provide the advantageous effects described in the above (1) to (3), (10) and (11). Further, in the semiconductor module according to the eighth embodiment the antenna conductor 3a4 is provided inside the multilayer board 20, so that the number of components required can be reduced.

Ninth Embodiment

Figure 19:
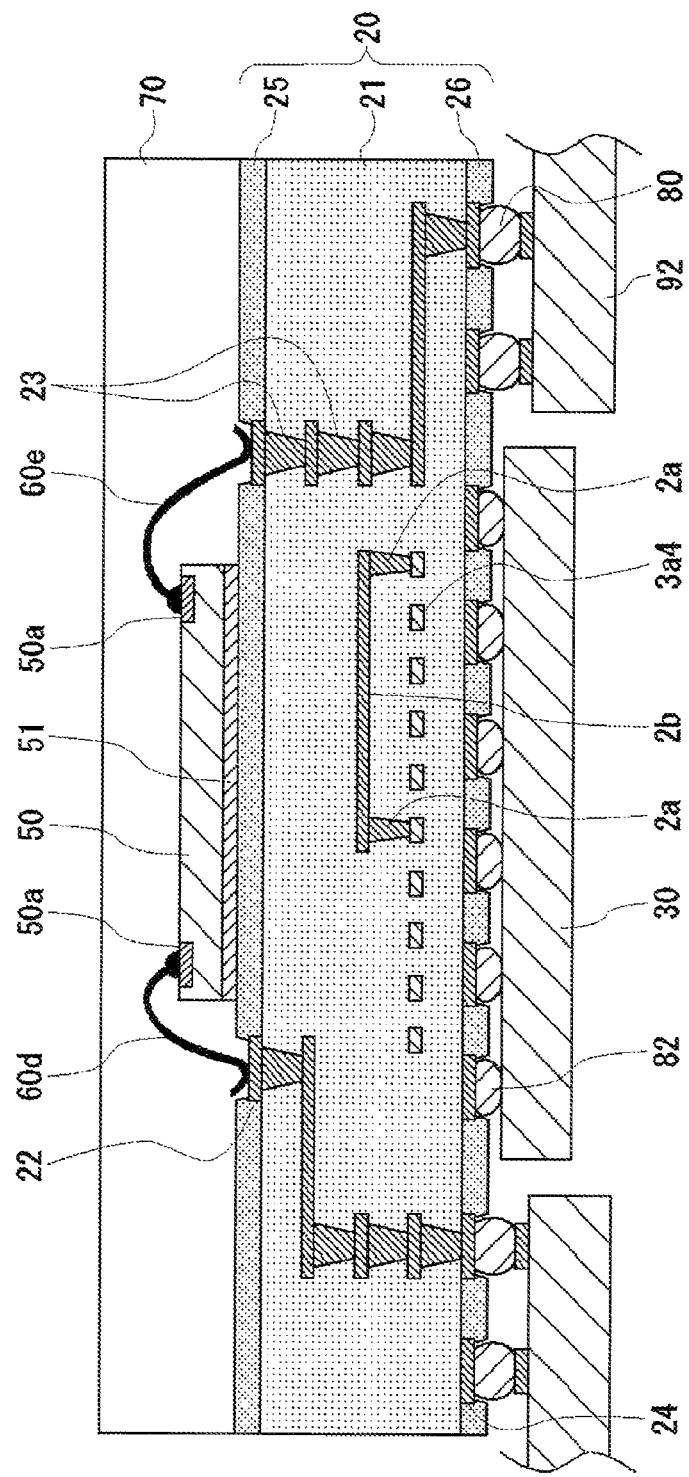
FIG. 19 is a cross-sectional view showing a structure of a semiconductor module according to a ninth embodiment of the present invention.

FIG. 19 is a cross-sectional view showing a structure of a semiconductor module according to a ninth embodiment of the present invention.

The semiconductor module according to the ninth embodiment includes a multilayer board 20, a first circuit mounted on one face of the multilayer board 20, and a second circuit element 50 mounted on the other face of the multilayer board 20. This semiconductor module is mounted on a packaging board 92, such as a mother board or a printed board, through the medium of solder balls 80.

The semiconductor module of the ninth embodiment differs from that of the eighth embodiment in that the second circuit element 50 is connected to the multilayer board 20 via a bonding wire. Otherwise, the ninth embodiment has the same features as the above eighth embodiment.

The second circuit element 50, which is, for instance, a circuit element with an analog circuit formed on the upper face thereof, is mounted on the multilayer board 20 through the medium of adhesive 51, such as a die-attach film. A plurality of pad electrodes 50a, which are connected to the analog circuit, are provided on the upper face (surface) of the outer periphery of the second circuit element 50, and they are electrically connected to pad electrodes (wiring layer 22) provided on the upper face of the multilayer board 20 via bonding wires 60d and 60e such as gold.

The molded resin layer 70, which is formed in such a manner as to cover the whole area above the multilayer board 20, seals the second circuit element 50. This molded resin layer 70 has a function of protecting the element against the external environment.

A semiconductor module according to the ninth embodiment may provide the advantageous effects described in the above (1) to (3), (10) and (11). Note that both the first circuit element 30 and the second circuit element 50 may be digital circuits. For example, when the first circuit element 30 is a high-speed memory and the second circuit element is a DSP (Digital Signal Processor), the structure achieved by the semiconductor module according to the ninth embodiment can suppress the effect of signal noise from the high-speed memory on the DSP.

Tenth Embodiment

Figure 20:
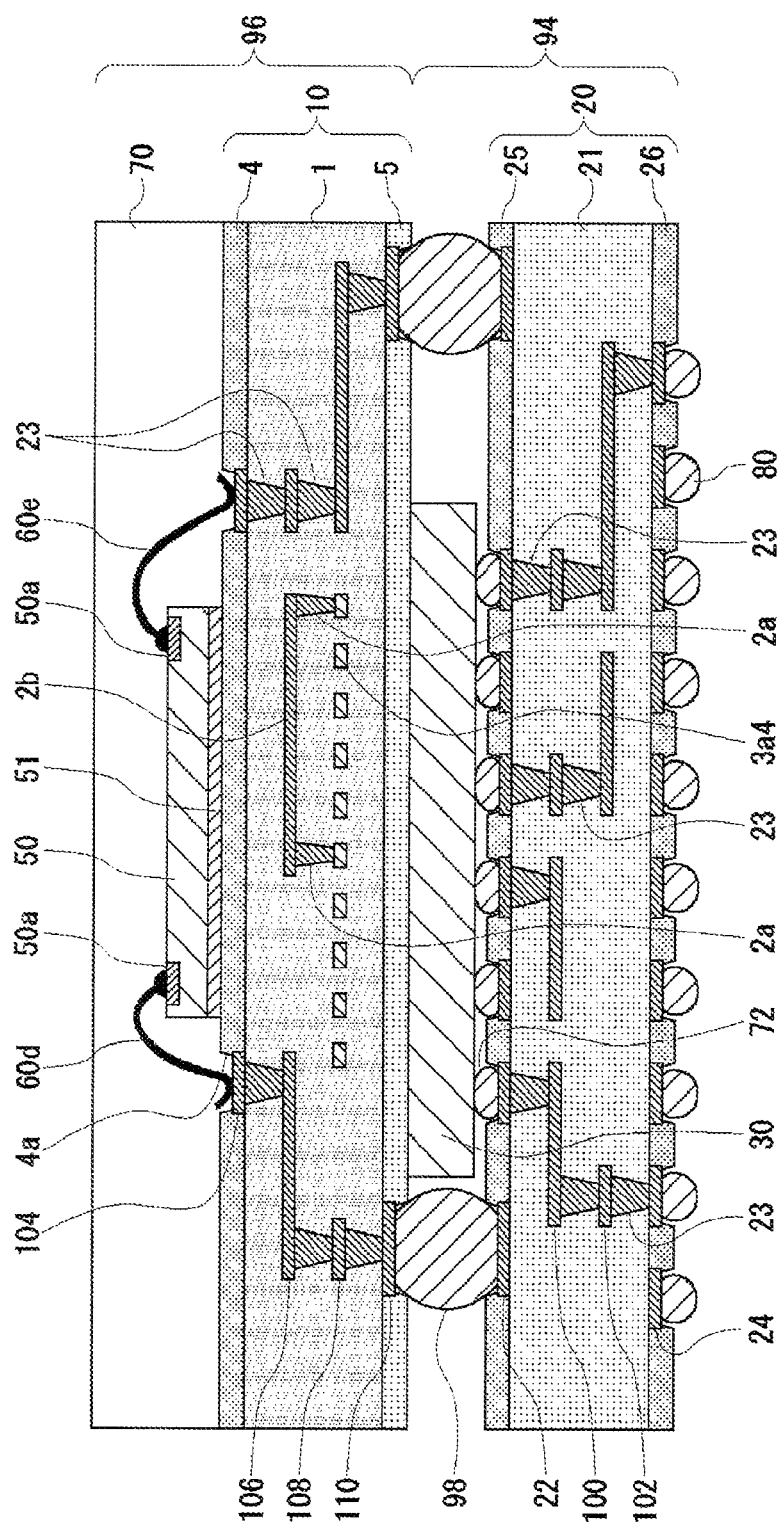
FIG. 20 is a cross-sectional view showing a structure of a semiconductor module according to a tenth embodiment of the present invention.

FIG. 20 is a cross-sectional view showing a structure of a semiconductor module according to a tenth embodiment of the present invention.

The semiconductor module according to the tenth embodiment is of a so-called package-on-package structure where a plurality of packages are stacked together. The semiconductor module according to the tenth embodiment includes a first package 94 and a second package 96 stacked on the first package 94, wherein the first package 94 includes a multilayer board 20 and a first circuit element 30 mounted on one surface of the multilayer board 20, and the second package 96 includes an interposer board 10 and a second circuit element 50 mounted on the interposer board 10.

The multilayer board 20, which is, for instance, a base board of four-layer wiring structure, has a wiring layer 22 and a wiring layer 24 on the upper face and the lower face thereof, respectively, with an insulating layer 21 disposed in between. The insulating layer 21 has wiring layers 100 and 102 therein, and these wiring layers are electrically connected to each other by a via-plug 23. The insulating layer 21 is formed of, for instance, an epoxy resin, whereas each wiring layer and the via-plug 23 are formed of, for instance, copper (Cu). Also, formed on the bottom face of the multilayer board 20 are a plurality of solder balls 80 which are connected to the wiring layer 24. The first circuit element 30 and the multilayer board 20 are connected through the medium of bumps 72.

The interposer board 10 is structured with, from top down, a solder resist layer 4, a wiring layer 104, an insulating resin layer 1 including via-plugs 2a and 23, wiring layers 2b, 106 and 108, an antenna conductor 3a4, a wiring layer 110, and a solder resist layer 5. On the upper face of the insulating resin layer 1, the wiring layer 104, which includes a bridge line and a pad electrode, is formed, and the solder resist layer 4 having an opening 4a in a position corresponding to the pad electrode is formed over this wiring layer 104. On the other hand, the antenna conductor 3a4 is formed inside the insulating layer 21. Further, the wiring layer 2b and the antenna conductor 3a4 are electrically connected with each other by the via-plug 2a. Note that the insulating resin layer 1 is formed of, for instance, an epoxy resin, whereas the wiring layers 2b, 104 and 106 and 110, the via-plugs 2a and 23 and the antenna conductor 3a4 are formed of, for instance, copper.

The second circuit element 50, which is, for instance, a circuit element with an analog circuit formed on the upper face thereof, is mounted on the multilayer board 20 through the medium of adhesive 51, such as a die-attach film. A plurality of pad electrodes 50a, which are connected to the analog circuit, are provided on the upper face (surface) of the outer periphery of the second circuit element 50, and they are electrically connected to pad electrodes (wiring layer 22) provided on the upper face of the multilayer board 20 via bonding wires 60d and 60e such as gold.

In the semiconductor according to the tenth embodiment, the second package 96 is stacked on the above-described first package 94 by the medium of the solder balls 98. Thus the antenna conductor 3a4 is arranged in a superposed manner such that the antenna conductor 3a4 shields at least part of a common region as viewed from top where the first circuit element and the second circuit element are overlapped with each other.

A semiconductor module according to the tenth embodiment may provide the advantageous effects described in the above (1) to (3), (10) and (11). Also, a semiconductor module comprised of a plurality of packages having different functions and capable of suppressing the effect of noise on between the packages can be realized in a smaller area.

Eleventh Embodiment

Figure 21:
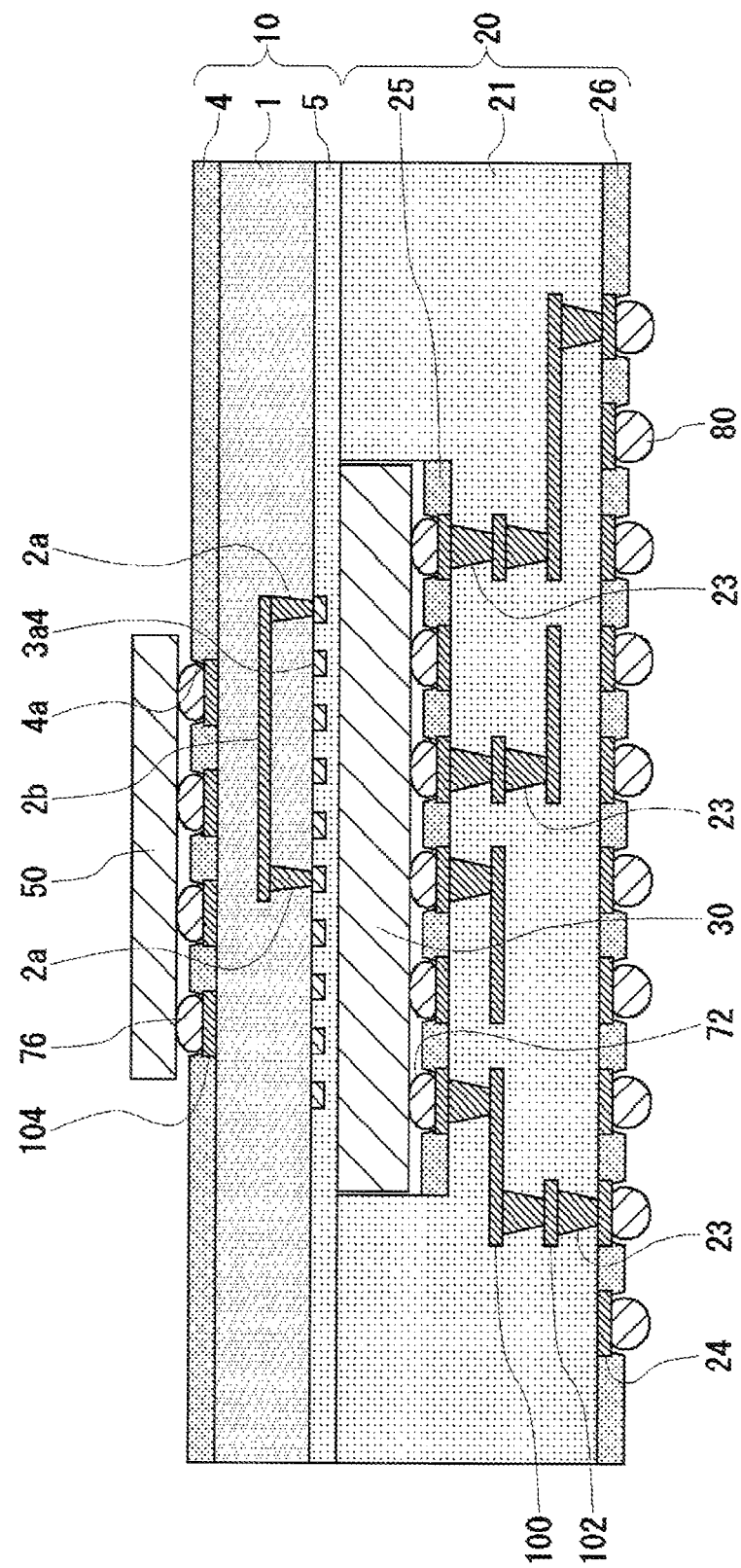
FIG. 21 is a cross-sectional view showing a structure of a semiconductor module according to an eleventh embodiment of the present invention.

FIG. 21 is a cross-sectional view showing a structure of a semiconductor module according to an eleventh embodiment of the present invention.

The semiconductor module according to the eleventh embodiment is of a structure such that circuit elements are embedded in a base board. The semiconductor module according to the eleventh embodiment includes a multilayer board 20 having a recess, a first circuit element 30 connected to a recess of the multilayer board 20 through the medium of bumps 72, an interposer board 10 mounted on the upper face of the multilayer board 20 in such a manner as to cover the first circuit element 30, and a second circuit element 50 connected to the interposer board 10 through the medium of bumps 76.

Similarly to the tenth embodiment, the multilayer board 20 is a base board of four-layer wiring structure. And the multilayer board 20 is of a shape such that a central part thereof is dented. The interposer board 10 is structured with, from top down, a solder resist layer 4, a wiring layer 104, an insulating resin layer 1 including a via-plug 2*a* and a wiring layer 2*b*, an antenna conductor 3*a*4, and a solder resist layer 5. The multilayer board 20 and the interposer board 10 are fixed together through the medium of adhesive or a connection member not shown. Note that a region connected by way of a bump may be filled in with an underfill material as appropriate.

A semiconductor module according to this eleventh embodiment may provide the advantageous effects described in the above (1) to (3), (10) and (11). Also, a semiconductor module comprised of a plurality of circuit elements having different functions and capable of suppressing the effect of noise on between the circuit elements can be realized in a smaller area.

Twelfth Embodiment

Figure 22:
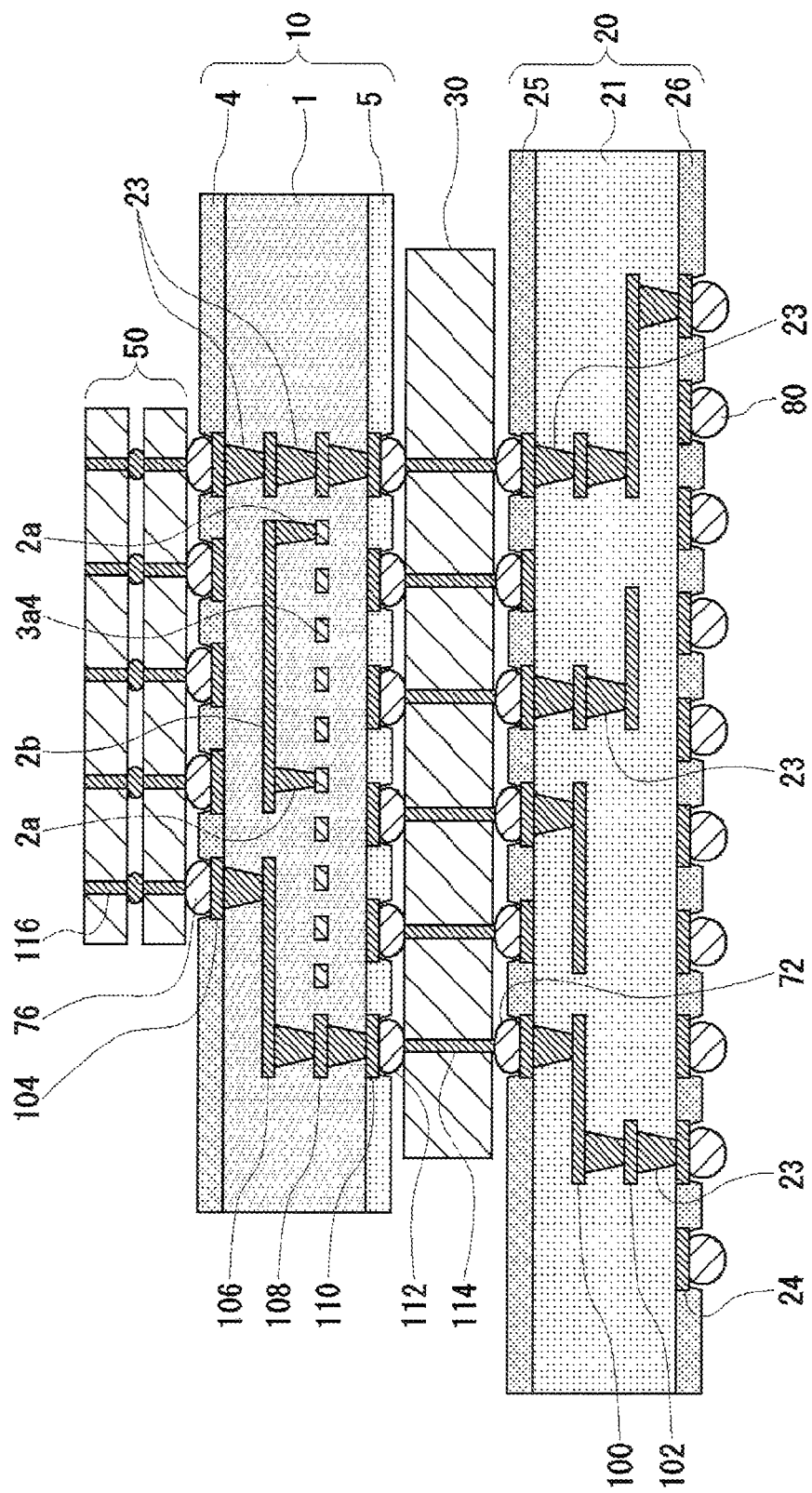
FIG. 22 is a cross-sectional view showing a structure of a semiconductor module according to a twelfth embodiment of the present invention.

FIG. 22 is a cross-sectional view showing a structure of a semiconductor module according to a twelfth embodiment of the present invention.

The semiconductor module according to the twelfth embodiment is characterized in that through-hole electrodes are formed in a circuit element. The semiconductor module according to the twelfth embodiment includes a multilayer board 20, a first circuit element 30 mounted on the multilayer board 20 through the medium of bumps 72, an interposer board 10 connected to the first circuit element 30 through the medium of bumps 112, and a second circuit element 50 connected to the interposer board 10 through the medium of bumps 76.

The interposer board 10 and the multilayer board 20 are nearly identical to those in the tenth embodiment and thus the repeated explanation is omitted here. The first circuit element 30 is, for instance, a memory controller where through-hole electrodes are provided to connect the both faces of the first element 30. The second circuit element 50 is, for instance, a laminated memory where two memory chips are coupled together through the medium of through-hole electrodes 116.

A semiconductor module according to this twelfth embodiment may provide the advantageous effects described in the above (1) to (3), (10) and (11). Also, a semiconductor module comprised of a plurality of circuit elements having different functions and capable of suppressing the effect of noise on between the circuit elements can be realized in a smaller area.

Thirteenth Embodiment

Next, a description will be given of a mobile apparatus (portable device) provided with the above-described semiconductor module. The mobile apparatus presented as an example herein is a mobile phone, but it may be any electronic apparatus, such as a personal digital assistant (PDA), a digital video cameras (DVC) and a digital still camera (DSC).

Figure 23:
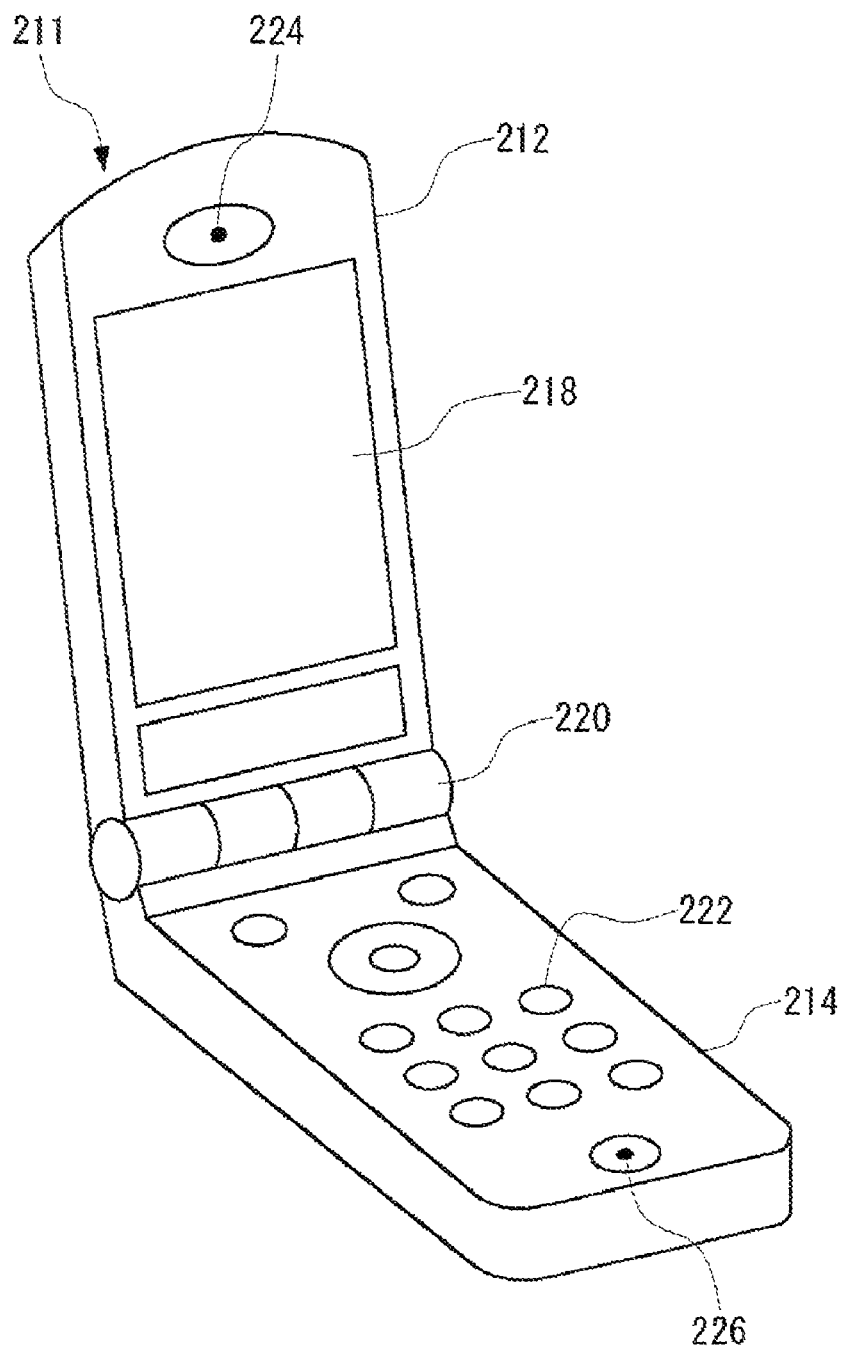
FIG. 23 illustrates a structure of a mobile phone according to a thirteenth embodiment of the present invention.

FIG. 23 illustrates a structure of a mobile phone provided with a semiconductor module according to a thirteenth embodiment of the present invention. A mobile phone 211 has a structure including a first casing 212 and a second casing 214 jointed together by a movable part 220. The first casing 212 and the second casing 214 are turnable/rotatable around the movable part 220 as the axis. The first casing 212 is provided with a display unit 218 for displaying characters, images and other information and a speaker unit 224. The second casing 214 is provided with a control module 222 with operation buttons and the like and a microphone 226. Note that a semiconductor module according to each of the above-described embodiments is mounted within a mobile phone 211 such as this.

Figure 24:
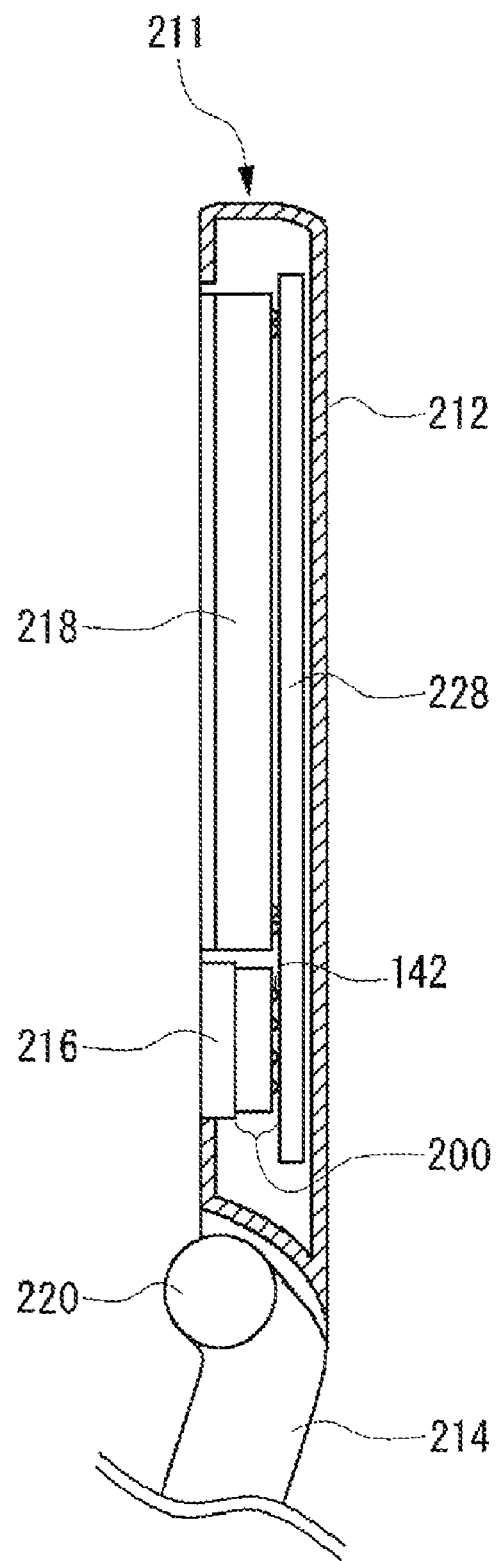
FIG. 24 is a partial cross-sectional view of a mobile phone shown in FIG. 23.

FIG. 24 is a partial cross-sectional view (cross-sectional view of the first casing 212) of the mobile phone shown in FIG. 23. A semiconductor module 200 according to this embodiments is mounted on a printed circuit board 228 via solder bumps 142, and is coupled electrically to a display unit 218 and the like by way of the printed circuit board 228 such as this. Also, a radiating substrate 216, such as a metallic substrate, is provided on the back side of the semiconductor module 200 (opposite side of solder bumps 142), so that the heat generated from the semiconductor module 200, for example, can be efficiently released outside the first casing 212 without getting trapped in the first casing 212.

By employing the mobile apparatus provided with the semiconductor module 200 according to the present embodiment, not only the operation inside the semiconductor module is stabilized but also the noise released externally from the semiconductor module is reduced and therefore the effect of noise on other components mounted inside the mobile apparatus can be reduced. Thus the reliability of a mobile apparatus with such a semiconductor module 200 mounted thereon is improved.

The present invention is not limited to the above-described embodiments only, and it is understood by those skilled in the art that various modifications such as changes in design may be made based on their knowledge and the embodiments added with such modifications are also within the scope of the present invention. For example, the structure of each embodiment may be combined as appropriate.

Although a case of a capacitor used as the passive element 40 to be connected externally is described in the first embodiment, the application of the present embodiments is not limited to such an arrangement. For example, a concentrated constant element, such as a resister or an inductor, or a distributed constant element, such as wiring, or a combination thereof may be used. In this case, too, the noise propagation can be effectively reduced by adjusting the frequencies or frequency bands to be shielded by absorption.

Although a case of the two-layer wiring structure used as the interposer board 10 is described in the first embodiment, the application of the present embodiments is not limited to such an arrangement. For example, a wiring structure of three layers or more may be used. Such an arrangement can increase the design freedom of the antenna conductor. For instance, when the interposer board is of a four-layer wiring structure, the antenna conductors functioning as two types of independent loop antennas can be disposed in superposition within the same region or the antenna conductors functioning as a series of loop antennas can be disposed within the same region in such a manner as to extend over different wiring layers. As such, the former enables a selective reduction of noise propagation at a plurality of frequencies, whereas the latter can reduce noise propagation at lower frequencies by forming a larger inductor in a limited plane region. As a result, the noise propagation can be reduced more effectively.

Although a case of a digital circuit formed as the first circuit element 30 and an analog circuit formed as the second circuit element 50 is described in the first embodiment, the application of the present embodiments is not limited to such an arrangement. For example, an analog circuit may be formed as the first circuit element 30 and a digital circuit may be formed as the second circuit element 50. Also, the first circuit element 30 or the second circuit element 50 may be a mixed circuit element of digital and analog circuits. In this case, too, the aforementioned advantageous effects can be achieved.

Although a case of the second circuit element 50 provided above the first circuit element 30 is described in the first embodiment, the application of the present embodiments is not limited to such an arrangement. For example, a plurality of circuit elements may be mounted above the first circuit element 30, and an interposer board having an antenna conductor may be interposed for each set of a plurality of circuit elements.

Although a case of the whole of the second circuit element 50 superposed within the first circuit element 30 is described in the first embodiment, the application of the present embodiments is not limited to such an arrangement. For example, the second circuit element 50 may be horizontally dislocated relative to the first circuit element 30, and part of the second circuit element 50 may be placed outside the first circuit element 30. In this case, too, if the common region S where the first circuit element 30 and the second circuit element 50 overlap each other as viewed from top is disposed in such superposition as to cover the antenna conductor 3a, then the noise arising from the circuit elements can be absorbed and shielded by the antenna conductor 3a.

Although a case of the dimensions of the second circuit element 50 smaller than those of the first circuit element 30 is described in the first embodiment, the application of the present embodiments is not limited to such an arrangement. For example, the dimensions of the second circuit element 50 may be equal to or larger than those of the first circuit element 30. In this case, too, the aforementioned advantageous effects can be achieved.

While the preferred embodiments of the present invention have been described using specific terms, such description is for illustrative purposes only, and it is to be understood that changes and variations may be made without departing from the spirit or scope of the appended claims.

What is claimed:

1. A semiconductor module, comprising:
    a first semiconductor chip;
    a conductor, provided above said first semiconductor chip; and
    a second semiconductor chip provided above said conductor,
    wherein the first semiconductor chip and the second semiconductor chip are not electrically connected directly to the conductor,
    said conductor being isolated from each of the first semiconductor chip and the second semiconductor chip and arranged between the first semiconductor chip and the second semiconductor chip in a superposed manner such that said conductor shields at least part of a common region as viewed from top where said first semiconductor chip and said second semiconductor chip overlap with each other,
    wherein the conductor functions as a loop antenna that, during operation of the semiconductor module, absorbs electromagnetic energy released as noise from the semiconductor chips.

2. A semiconductor module according to claim 1, wherein said conductor is arranged in a superposed manner such that said conductor selectively covers a circuit region, which is a noise generating source, partially contained in at least one of said first semiconductor chip circuit element and said second element circuit.

3. A semiconductor module according to claim 1, wherein said conductor has an outer edge in a position outside said second semiconductor chip.

4. A semiconductor module according to claim 1, wherein noise propagation between said first semiconductor chip and said second semiconductor is attenuated by a resonance of the loop antenna of said conductor.

5. A semiconductor module according to claim 1, wherein noise propagation between said first semiconductor chip circuit element and said second semiconductor chip circuit element is attenuated by a resonance of the loop antenna of said conductor.

6. A semiconductor module according to claim 2, wherein noise propagation between said first semiconductor chip and said second semiconductor chip circuit element is attenuated by a resonance of the loop antenna of said conductor.

7. A semiconductor module according to claim 3, wherein noise propagation between said first semiconductor chip and said second semiconductor chip is attenuated by a resonance of the loop antenna of said conductor.

8. A semiconductor module according to claim 1, wherein said conductor is such that a passive element is connected to a feeding point of the loop antenna formed by said conductor.

9. A semiconductor module according to claim 1, wherein said conductor is such that a passive element is connected to a feeding point of the loop antenna formed by said conductor.

10. A semiconductor module according to claim 2, wherein said conductor is such that a passive element is connected to a feeding point of the loop antenna formed by said conductor.

11. A semiconductor module according to claim 3, wherein said conductor is such that a passive element is connected to a feeding point of the loop antenna formed by said conductor.

12. A semiconductor module according to claim 8, wherein noise propagation between said first semiconductor chip and said second semiconductor chip is attenuated by a resonance between said conductor and the passive element.

13. A semiconductor module according to claim 9, wherein noise propagation between said first semiconductor chip and said second semiconductor chip is attenuated by a resonance between said conductor and the passive element.

14. A semiconductor module according to claim 10, wherein noise propagation between said first semiconductor chip and said second semiconductor chip is attenuated by a resonance between said conductor and the passive element.

15. A semiconductor module according to claim 11, wherein noise propagation between said first semiconductor chip and said second semiconductor chip is attenuated by a resonance between said conductor and the passive element.

16. A semiconductor module according to claim 1, wherein said conductor is of spiral shape.

17. A semiconductor module according to claim 1, wherein said conductor is of spiral shape.

18. A semiconductor module according to claim 2, wherein said conductor is of spiral shape.

19. A portable device which mounts a semiconductor module according to claim 1.

20. The semiconductor module of claim 1 wherein the conductor has dimensions larger than dimensions of the common region where the first and second semiconductor chips overlap.

* * * * *